United States Patent
Bhattacharya et al.

(10) Patent No.: US 8,598,941 B2
(45) Date of Patent: Dec. 3, 2013

(54) HYBRID IMPEDANCE COMPENSATION IN A BUFFER CIRCUIT

(75) Inventors: Dipankar Bhattacharya, Macungie, PA (US); Ashish V. Shukla, Allentown, PA (US); John Christopher Kriz, Palmerton, PA (US); Makeshwar Kothandaraman, Bangalore (IN); Pankaj Kumar, Bangalore (IN); Pramod Parameswaran, Bangalore (IN)

(73) Assignee: LSI Corporation, San Jose, CA (US)

( * ) Notice: Subject to any disclaimer, the term of this patent is extended or adjusted under 35 U.S.C. 154(b) by 151 days.

(21) Appl. No.: 13/165,195

(22) Filed: Jun. 21, 2011

(65) Prior Publication Data

US 2012/0326768 A1    Dec. 27, 2012

(51) Int. Cl.
*H01L 37/00* (2006.01)
(52) U.S. Cl.
USPC .................... 327/513; 327/262; 327/512
(58) Field of Classification Search
USPC ......................... 327/262, 512, 513
See application file for complete search history.

(56) References Cited

U.S. PATENT DOCUMENTS

| | | | | |
|---|---|---|---|---|
| 6,087,853 | A * | 7/2000 | Huber et al. | 326/83 |
| 6,459,320 | B2 * | 10/2002 | Lee | 327/310 |
| 7,127,368 | B2 * | 10/2006 | Choi | 702/130 |
| 7,218,169 | B2 * | 5/2007 | Bhattacharya et al. | 327/543 |
| 8,159,262 | B1 * | 4/2012 | Bhattacharya et al. | 326/30 |
| 2003/0081484 | A1 * | 5/2003 | Kobayashi et al. | 365/222 |
| 2005/0074051 | A1 * | 4/2005 | Won et al. | 374/170 |
| 2005/0134364 | A1 * | 6/2005 | Bhattacharya et al. | 327/543 |
| 2008/0297226 | A1 * | 12/2008 | Bhattacharya et al. | 327/362 |
| 2011/0029266 | A1 * | 2/2011 | Lee | 702/64 |
| 2012/0034713 | A1 * | 2/2012 | Lee | 438/5 |

* cited by examiner

*Primary Examiner* — Ryan Jager
(74) *Attorney, Agent, or Firm* — Otterstedt, Ellenbogen & Kammer, LLP

(57) ABSTRACT

A compensation circuit for controlling a variation in output impedance of at least one buffer circuit includes a monitor circuit and a control circuit coupled with the monitor circuit. The monitor circuit includes a pull-up portion including at least one PMOS transistor and a pull-down portion comprising at least one NMOS transistor. The monitor circuit is configured to track an operation of an output stage of the buffer circuit and is operative to generate at least a first control signal indicative of a status of at least one characteristic of corresponding pull-up and pull-down portions in the output stage of the buffer circuit over variations in PVT conditions to which the buffer circuit may be subjected. The control circuit is operative to generate a set of digital control bits as a function of the first control signal. The set of digital control bits is operative to compensate the pull-up and pull-down portions in the output stage of the buffer circuit over prescribed variations in PVT conditions.

20 Claims, 9 Drawing Sheets

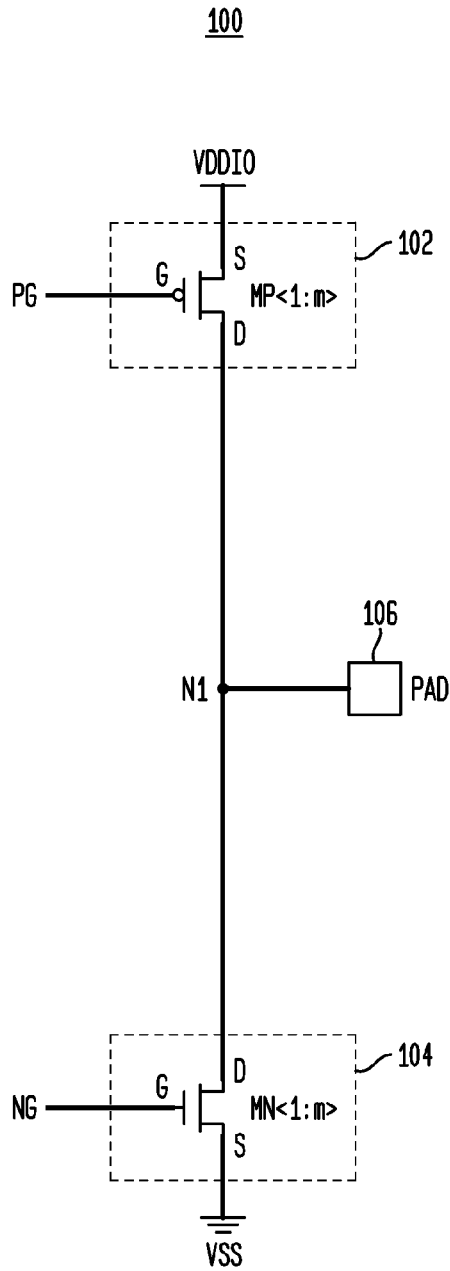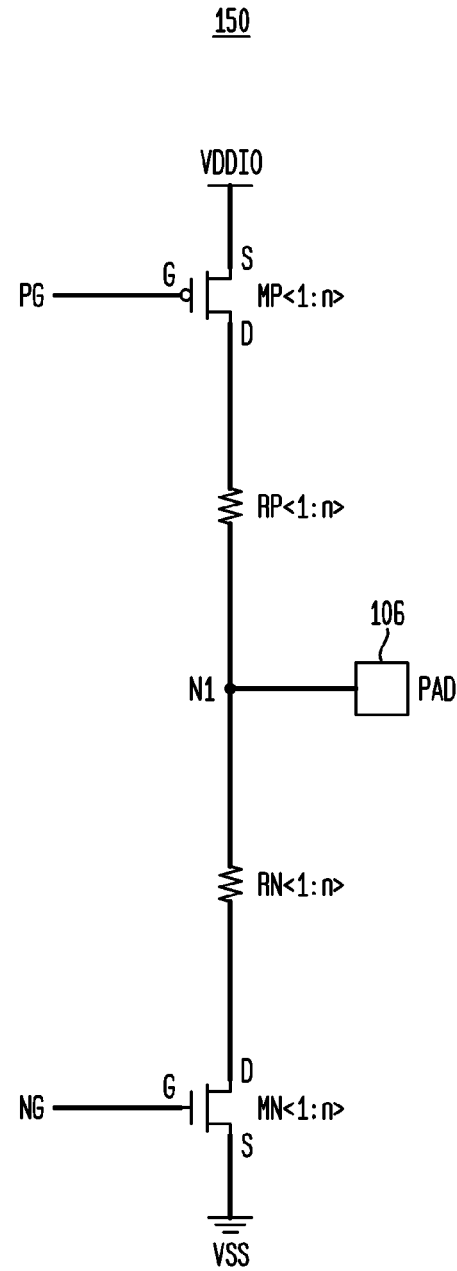

170

400

500

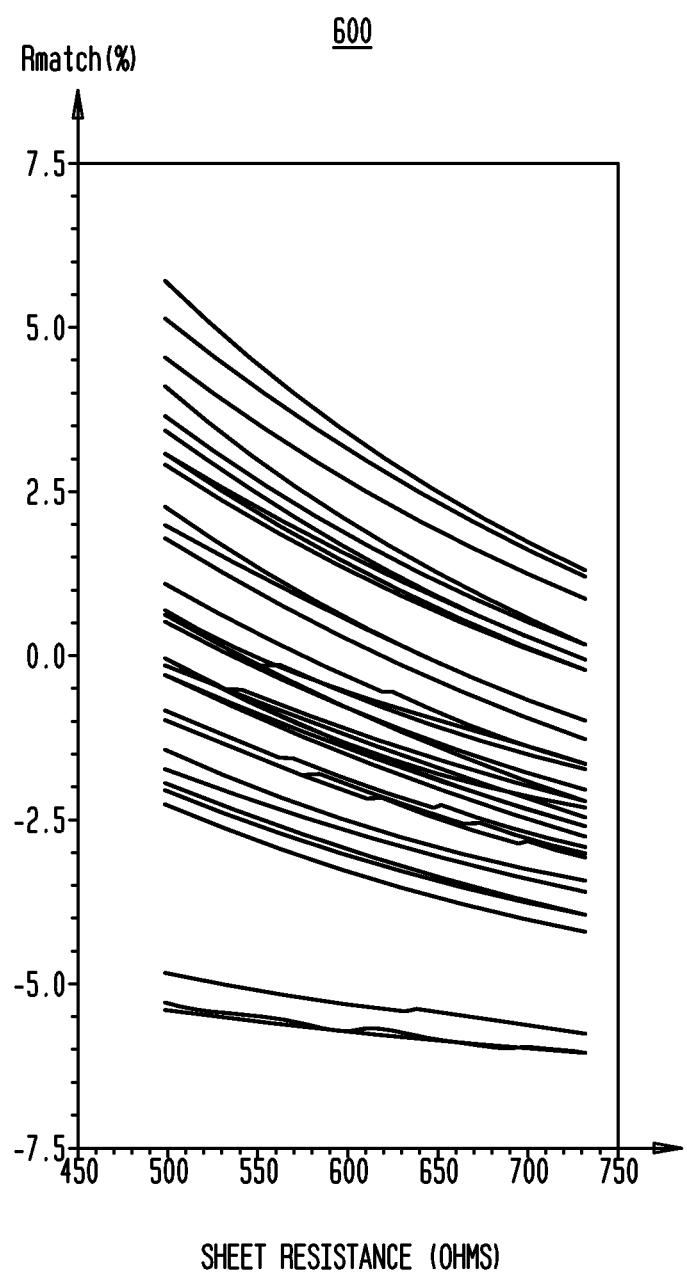

US 8,598,941 B2

HYBRID IMPEDANCE COMPENSATION IN A BUFFER CIRCUIT

FIELD OF THE INVENTION

The present invention relates generally to electronic circuits, and more particularly relates to compensation techniques for use in a buffer circuit.

BACKGROUND OF THE INVENTION

In modern electronic circuits, such as, for example, input/output (IO) buffers, it is desirable to control the variation in output impedance and relative variation between pull-up and pull-down impedances of the IO buffers for a variety of reasons, including, but not limited to, transmission line matching, minimizing switching noise (e.g., di/dt), optimizing signal swing, etc. In many high-speed, high-bandwidth applications, such as, for example, memory interfacing (e.g., double data rate 3 (DDR3) or DDR4 memory), it is important to control the output impedance of the buffer within a specified tolerance over a prescribed range of operating conditions so as to reduce signal degradation. It is also important to control pull-up and pull-down impedances of the buffer in such a way that the relative difference between the impedances (i.e., impedance mismatch) is minimized.

In order to achieve such tight control of output impedance and pull-up/pull-down impedance mismatch, a buffer, often referred to as a compensated buffer, is typically employed which is adapted to compensate for variations in integrated circuit (IC) process, supply voltage and/or temperature (PVT) conditions to which the buffer may be subjected. In one implementation, a PVT compensated buffer utilizes a compensation circuit including a PVT control block which monitors a deviation in output impedance of a block of one or more reference devices matched to corresponding devices (e.g., pre-drivers) in an output stage of the buffer to be compensated. The PVT control block generates a set of digital bits, often referred to as "PVT bits" (PVTBITS), that are used to control the reference devices (e.g., turning the devices on or off) so as to maintain a constant output impedance. The output impedance of the reference block will be a function of the number of devices in the block that are turned on or off at any given time. These PVT bits are also fed to the buffer for controlling the output impedance of the buffer output stage devices in a corresponding manner. The number of pre-drivers in the buffer output stage is directly proportional to the number of digital control bits.

In the context of metal-oxide-semiconductor (MOS) transistor devices, since p-channel MOS (PMOS) transistor devices and n-channel MOS (NMOS) transistor devices do not generally track one another, pull-up devices (which typically employ PMOS transistors) are traditionally compensated independently from pull-down devices (which typically employ NMOS transistors), thereby resulting in significantly increased complexity of the design, reduced IC layout area efficiency, and higher relative error (impedance mismatch) between pull-up and pull-down impedances. Accordingly, such conventional approaches to buffer impedance compensation are impractical and/or undesirable.

SUMMARY OF THE INVENTION

The present invention, in illustrative embodiments thereof, relates to compensation techniques for controlling a variation in output impedance and for controlling a relative variation between pull-up and pull-down impedance of a buffer circuit over variations in PVT conditions to which the buffer circuit may be subjected. The inventive buffer compensation techniques are performed using a hybrid approach whereby a status of both pull-up and pull-down impedances are combined to generate a single set of compensation bits that are applied to both pull-up and pull-down drivers. In this manner, design complexity and layout area penalty are significantly reduced compared to alternative compensation approaches.

In accordance with an embodiment of the invention, a compensation circuit for controlling a variation in output impedance of at least one buffer circuit includes a monitor circuit and a control circuit coupled with the monitor circuit. The monitor circuit includes a pull-up portion including at least one PMOS transistor and a pull-down portion comprising at least one NMOS transistor. The monitor circuit is configured to track an operation of an output stage of the buffer circuit and is operative to generate at least a first control signal indicative of a status of at least one characteristic of corresponding pull-up and pull-down portions in the output stage of the buffer circuit over variations in PVT conditions to which the buffer circuit may be subjected. The control circuit is operative to generate a set of digital control bits as a function of the first control signal. The set of digital control bits is operative to compensate the pull-up and pull-down portions in the output stage of the buffer circuit over prescribed variations in PVT conditions.

In accordance with another embodiment of the invention, a compensated buffer circuit includes at least one buffer including an output stage operative to receive an input signal and to generate an output signal at an output of the buffer circuit. The output stage includes a pull-up portion comprising at least one PMOS transistor and a pull-down portion comprising at least one NMOS transistor. The compensated buffer circuit further includes at least one compensation circuit coupled with the buffer for controlling a variation in output impedance of the buffer. The compensation circuit includes a monitor circuit and a control circuit coupled with the monitor circuit. The monitor circuit includes a pull-up portion including at least one PMOS transistor and a pull-down portion comprising at least one NMOS transistor. The monitor circuit is configured to track an operation of an output stage of the buffer circuit and is operative to generate at least a first control signal indicative of a status of at least one characteristic of corresponding pull-up and pull-down portions in the output stage of the buffer circuit over variations in PVT conditions to which the buffer circuit may be subjected. The control circuit is operative to generate a set of digital control bits as a function of the first control signal. The set of digital control bits is operative to compensate the pull-up and pull-down portions in the output stage of the buffer circuit over prescribed variations in PVT conditions.

These and other features, objects and advantages of the present invention will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein:

FIG. 1A is a schematic diagram depicting at least a portion of an exemplary output driver stage suitable for use in a buffer circuit application;

FIG. 1B is a schematic diagram depicting at least a portion of an illustrative linearized output driver stage suitable for use in a buffer circuit application;

FIG. 6A is a graph including exemplary simulation waveforms illustrating a relative difference between pull-up and pull-down impedances using hybrid compensation techniques according to embodiments of the present invention;

Figure 1C:
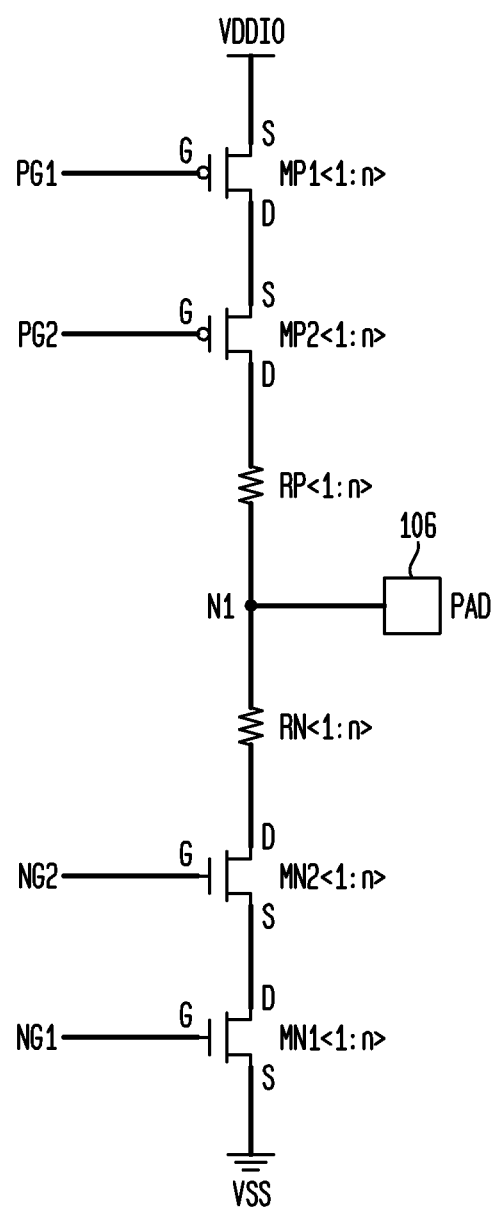
FIG. 1C is a schematic diagram depicting at least a portion of an illustrative high-voltage output driver stage suitable for use in a buffer circuit application.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION OF THE INVENTION

The present invention, according to aspects thereof, will be described herein in the context of illustrative compensation circuits adapted to control a variation in output impedance and to control a relative variation between pull-up and pull-down impedances of a buffer circuit over variations in PVT conditions to which the buffer circuit may be subjected. It should be understood, however, that the present invention is not limited to these or any other particular circuit arrangements. Rather, the invention is more generally applicable to techniques for compensating a buffer circuit in such a way that design complexity and layout area penalty is significantly reduced compared to conventional buffer design approaches, among other advantages. To accomplish this, embodiments of the invention utilize a hybrid compensation approach whereby a status of both pull-up and pull-down impedances are combined to generate a single set of compensation bits that are applied to both pull-up and pull-down drivers in the buffer circuit. In this manner, design complexity and layout area penalty are significantly reduced compared to alternative compensation approaches. Moreover, it will become apparent to those skilled in the art given the teachings herein that numerous modifications can be made to the embodiments shown that are within the scope of the present invention. That is, no limitations with respect to the specific embodiments described herein are intended or should be inferred.

Although implementations of the present invention described herein may be implemented using PMOS and NMOS transistor devices, as may be formed using a complementary metal-oxide-semiconductor (CMOS) fabrication process, it is to be appreciated that the invention is not limited to such transistor devices and/or such a fabrication process, and that other suitable devices, such as, for example, bipolar junction transistors (BJTs), etc., and/or fabrication processes (e.g., bipolar, BiCMOS, etc.), may be similarly employed, as will be understood by those skilled in the art. Moreover, although preferred embodiments of the invention are typically fabricated in a silicon wafer, embodiments of the invention can alternatively be fabricated in wafers comprising other materials, including but not limited to Gallium Arsenide (GaAs), Indium Phosphide (InP), etc.

As previously stated, the variation between PMOS and NMOS devices operating under certain PVT corners can be substantially large, and therefore one cannot generally rely on merely compensating one device type (e.g., PMOS) and then applying the same compensation to the other device type (e.g., NMOS). This often necessitates separate and independent compensation for pull-up and pull-down devices, respectively. However, even when independent compensation of the PMOS and NMOS devices is used, unless a very fine granularity compensation scheme is employed, at the expense of IC area and complexity, it is likely that the buffer may fail an impedance mismatch specification even though the buffer is able to achieve very tight control of pull-up and pull-down impedances.

An alternative approach to compensation is to provide a large amount of granularity in the compensation steps and compensate either the pull-up or pull-down devices first. Once the first set of devices (e.g., pull-down devices) has been compensated, the other set of devices (e.g., pull-up devices) is then compensated in conjunction with the newly compensated devices. This approach works well but requires a complex scheme to control the compensation process and requires significantly more IC area compared to other compensation approaches.

In another buffer compensation scheme, one impedance type (e.g., pull-up or pull-down) is first compensated using a first set of compensation bits and then the other impedance type is compensated using a second set of compensation bits generated at least in part as a function of a monitoring circuit in the buffer. While this approach works well, it has been found that the output range of the monitoring circuit may not be wide enough under certain conditions to ensure that a correct decision is reached for generating the second set of compensation bits. Moreover, two sets of compensation bits are maintained using this approach, which can lead to an IC area penalty and increased complexity in the implementation.

FIG. 1A is a schematic diagram depicting at least a portion of an exemplary output driver stage 100 suitable for use in a buffer circuit application. Output driver stage 100 preferably comprises a pull-up circuit 102 connected between and a first voltage supply, which may be a higher input/output (I/O) voltage supply, VDDIO (e.g., about 1.8 volts), and an output node N1, and a pull-down circuit 104 connected between node N1 and a second voltage supply, which may be a voltage return, VSS, of the output stage (e.g., about zero volts or ground). It is to be understood that the invention is not limited to any specific voltage supply levels. Output node N1 is preferably connected with an I/O pad (PAD) 106 which is operative to provide an external connection with the output stage 100.

Pull-up circuit 102 preferably includes a plurality, m, of PMOS transistor devices MP (i.e., MP<1:m>) which may be formed as parallel fingers in a conventional manner, where m is an integer. Likewise, pull-down circuit 104 preferably includes a plurality, in, of NMOS transistor devices MN (i.e., MN<1:m>) which may be formed as parallel fingers in a conventional manner. PMOS transistors MP<1:m> are driven by a first control signal, PG, and NMOS transistors MN<1:m> are driven by a second control signal, NG. More particularly, a source (S) of each of PMOS transistors MP<1:m> is adapted for connection with the first voltage supply VDDIO, a drain (D) of MP<1:m> is connected with a drain of each of NMOS transistors MN<1:m> at node N1, a gate (G) of MP<1:m> is adapted for receiving the first control signal PG, a source of MN<1:m> is adapted for connection with the second voltage supply VSS, and a gate of MN<1:m> is adapted for receiving the second control signal NG. It is to be noted that pull-up and pull-down circuit sections need not have the same number of legs (m) and each leg or a parallel combination of legs may be driven by respective gate voltages PGi or NGi, where i is an integer.

It is to be appreciated that, because an MOS device is symmetrical in nature, and thus bi-directional, the assignment of source and drain designations in the MOS device is essentially arbitrary. Therefore, the source and drain of a given MOS device may be referred to herein generally as first and second source/drain, respectively, where "source/drain" in this context denotes a source or a drain.

Control signals PG and NG may be generated, for example, by a pre-driver circuit coupled with output stage 100. Pre-driver logic is preferably designed in such a manner that when signal PG transitions to a logic high level (e.g., about VDDIO or 1.8 volts), signal NG also transitions to a logic high level (preferably having substantially the same edge/transition rate), thereby pulling node N1 to a logic low level (e.g., about VSS or zero volts). Similarly, when signal NG transitions to a logic low level, signal PG also transitions to a logic low level, thereby pulling node N1 to a logic high level. Because of the non-linear nature of an output stage formed solely of active devices, the impedance of the buffer circuit employing output stage 100 is typically measured at about 400 millivolts (mV) away from the voltage supply rails. Thus, for example, when pad 106 is driven high, pull-up impedance is measured at VDDIO−400 mV (e.g., about 1.4 volts for VDDIO=1.8 volts). Similarly, when pad 106 is driven low, pull-down impedance is measured at VSS+400 mV (e.g., about 400 mV for VSS=0).

Output stage 100 shown in FIG. 1A can be modified as depicted in FIG. 1B to achieve enhanced linearity. Specifically, with reference to FIG. 1B, an exemplary output stage 150 is shown which is comparable to the output stage 100 of FIG. 1A, except that each finger of PMOS transistors MPi, i=1 . . . n, where i and n are integers (i.e., MP<1:n>), is connected in series with a corresponding resistor, RPi, 1=1 . . . n (i.e., RP<1:n>). Similarly, each finger of NMOS transistors MNi, i=1 . . . n (i.e., MN<1:n>), is connected in series with a corresponding resistor, RNi, i=1 . . . n (i.e., RN<1:n>). More particularly, for each finger of PMOS transistors MP<1:n>, a source of a given transistor MPi is adapted for connection with VDDIO, a gate of MPi is adapted for receiving control signal PG, a drain of MPi is connected with a first terminal of corresponding resistor RPi, and a second terminal of RPi is connected with pad 106. Likewise, for each finger of NMOS transistors MN<1:n>, a source of a given transistor MNi is adapted for connection with VSS, a gate of MNi is adapted for receiving control signal NG, a drain of MNi is connected with a first terminal of corresponding resistor RNi, and a second terminal of RNi is connected with pad 106.

Polysilicon (i.e., poly) resistors are preferably employed for each of resistors RPi and RNi, although alternative materials (e.g., n+ or p+ diffusion, n-tub resistors, etc.) may be selected for the resistors depending upon the particular application in which output stage 150 is to be used. The respective resistance values of resistors RPi and RNi are preferably selected so as to be substantially greater than a drain-to-source impedance of the active devices (namely, transistors MPi and MNi), such that the impedance contribution of the active devices is a relatively small percentage (e.g., about twenty-five percent nominally) of the total output impedance of the output stage 150. A linear portion of the total impedance (e.g., attributable primarily to resistors RPi and RNi) is preferably made higher than an active portion of the total impedance (e.g., attributable to transistors MPi and MNi) but ultimately the size of resistors RPi and RNi will be a trade-off between results versus size and performance. A smaller active impedance means higher transistor size, higher di/dt (i.e., change in current (di) with respect to change in time (dt)), higher pre-driver size, etc. For an output stage configured in the manner shown in FIG. 1B, impedance is typically measured with the output (node N1) at half the voltage supply $$\left(\text{e.g.}, \frac{VDDIO - VSS}{2}\right),$$

rather than at 400 mV away from the voltage supply rails as in FIG. 1A.

FIG. 1C is a schematic diagram depicting at least a portion of an illustrative high-voltage output driver stage 170 suitable for use in a buffer circuit application. Output driver stage 170 may be used, for example, in applications in which the voltage supply VDDIO is higher than a prescribed maximum drain-to-source voltage which the PMOS and/or NMOS transistor devices can otherwise sustain without damage (e.g., VDDIO equal to about 3.6 volts or higher, although the invention is not limited to any specific voltage level for VDDIO). In this instance, a plurality of PMOS transistor devices and/or a plurality of NMOS transistor devices are connected together in series between the voltage supplies VDDIO and VSS. It is to be appreciated that the invention is not limited to the number of series-connected transistors employed in the output driver stage 170.

More particularly, output driver stage 170 may comprise a first PMOS transistor device, which alternatively may include a plurality of parallel-connected transistor devices, MP1<1:n> and a second PMOS transistor device, which may also include a plurality of parallel-connected transistor devices, MP2<1:n>. A source of MP1<1:n> is adapted for connection with VDDIO, a drain of MP1<1:n> is connected with a source of MP2<1:n>, a drain of MP2<1:n> is connected with a first terminal of a first resistor, RP<1:n>, a second terminal of RP<1:n> is connected with an external I/O pad (PAD) 106 at node N1, a gate of MP1<1:n> is adapted for receiving a first bias signal, PG1, and a gate of MP2<1:n> is adapted for receiving a second bias signal, PG2. Similarly, output driver stage 170 may comprise a first NMOS transistor device, which alternatively may include a plurality of parallel-connected transistor devices, MN1<1:n> and a second NMOS transistor device, which may also include a plurality of parallel-connected transistor devices, MN2<1:n>. A source of MN1<1:n> is adapted for connection with VSS, a drain of MN1<1:n> is connected with a source of MN2<1:n>, a drain of MN2<1:n> is connected with a first terminal of a first resistor, RN<1:n>, a second terminal of RN<1:n> is connected with pad 106 at node N1, a gate of MN<1:n> is adapted for receiving a third bias signal, NG1, and a gate of MN2<1:n> is adapted for receiving a fourth bias signal, NG2. In this manner, the voltage across any one of transistors MP1<1:n>, MP2<1:n>, MN1<1:n>, and MN2<1:n> in the output driver stage 170 will be less than or equal to a maximum prescribed voltage level of the respective devices.

Figure 2:
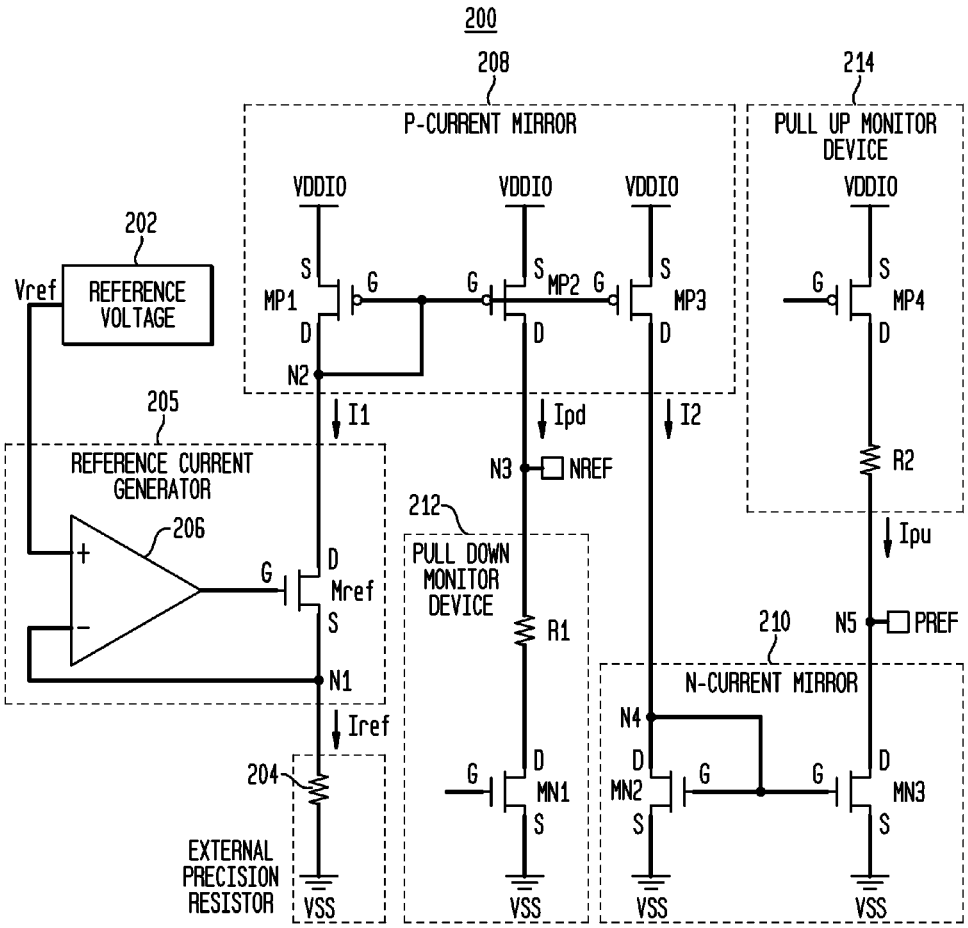
FIG. 2 is a schematic diagram depicting at least a portion of an exemplary PVT compensation circuit which utilizes separate and independent pull-up and pull-down impedance compensation and that may be modified to implement techniques of the present invention.
Figure 2:
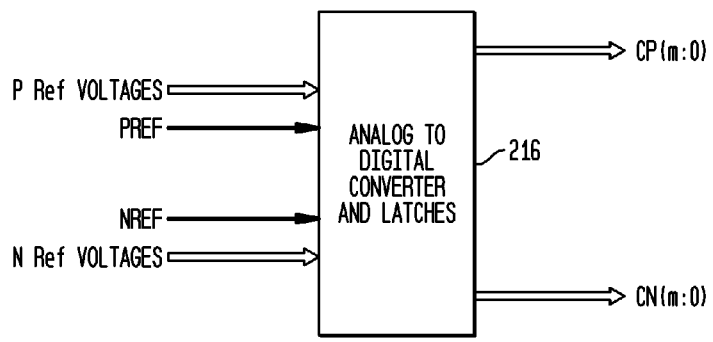

FIG. 2 is a schematic diagram depicting at least a portion of an exemplary PVT compensation circuit 200 which utilizes separate and independent pull-up and pull-down impedance compensation. PVT compensation circuit 200 may be employed, for example, in a compensated buffer circuit for compensating one of more PMOS and NMOS transistor devices in at least an output stage of the buffer circuit. Referring now to FIG. 2, a reference voltage, Vref, generated by a reference voltage source 202, is preferably converted into a reference current, Iref, through a precision resistor. More particularly, resistor 204 is preferably a precision external resistor, although an internal resistor may alternatively be used where a lower accuracy can be tolerated. Resistor 204 is used to generate a substantially constant current, Iref, within the PVT compensation circuit 200 which is either forced into one or more monitor devices (e.g., pull-down monitor device 212 or pull-up monitor device 214) in the PVT compensation circuit, or is compared against a current generated in the one or more monitor devices. The monitor devices are preferably substantially matched to one or more corresponding devices forming an output stage of a compensated buffer circuit, as will be described in further detail below. In this manner, PVT compensation circuit 200 will more accurately compensate for variations in PVT conditions to which the buffer circuit may be subjected.

Reference voltage source 202 which is operative to generate the reference voltage Vref may comprise, for example, a band gap reference circuit. Alternatively, reference voltage source 202 may comprise a resistor divider, such that the reference voltage Vref may be generated using some fraction of a voltage supply (e.g., VDDIO), in accordance with conventional voltage division techniques. The invention contemplates other methods for generating a reference voltage, as will be known by those skilled in the art. Similarly, the reference voltage Vref may be generated externally and supplied to the PVT compensation circuit 200. The reference voltage Vref is applied across resistor 204 using a reference current generator circuit 205, which functions essentially as a voltage-to-current converter.

Reference current generator circuit 205 preferably comprises an operational amplifier (op-amp) 206 and an NMOS transistor device, Mref, coupled with the op-amp in a feedback configuration. Specifically, a first input of op-amp 206, which may be a non-inverting (+) input, is adapted to receive the reference voltage Vref, an output of the op-amp is connected to a gate of transistor Mref, a source of Mref is connected to a second input of the op-amp, which may be an inverting (−) input, at a first node N1. A first terminal of precision resistor 204 is connected with the reference current generator at node N1 and a second terminal of resistor 204 is adapted for connection with a voltage return of the compensation circuit 200, which may be VSS or ground. In this manner, because of the feedback configuration of the op-amp 206, node N1 will be substantially equal to the reference voltage Vref. A drain of transistor Mref forms an output of the reference current generator circuit 205 and is operative to generate a current, I1, which is ideally equal to Iref and is a function of reference voltage Vref and a resistance of resistor 204. Since Vref and the resistance value of resistor 204 are both known, the reference current Iref, and thus current I1, will also be known.

The reference current Iref is preferably replicated, using, for example, a first current mirror (P-current mirror) 208 and a second current mirror (N-current mirror) 210, to provide a pull-down current, Ipd, to one or multiple pull-down structures (e.g., transistors MNi shown in FIGS. 1A and 1B), and to provide a pull-up current, Ipu, to one or multiple pull-up structures (e.g., transistors MPi in FIGS. 1A and 1B), respectively. More particularly, first current mirror 208 preferably includes first, second and third PMOS transistor devices MP1, MP2 and MP3, respectively. Transistor MP1 is connected in a diode configuration, having a source adapted for connection with VDDIO, and a gate and drain connected to a drain of transistor Mref in reference current generator circuit 205 at node N2. Gates of transistors MP2 and MP3 are connected with the gate of transistor MP1 at node N2, sources of MP2 and MP3 are adapted for connection with VDDIO, a drain of MP2 is connected with a pull-down monitor circuit 212 at node N3, and a drain of MP3 is connected with the second current mirror 210 at node N4. Since the gates of transistors MP1, MP2 and MP3 are connected together and the sources of MP1, MP2 and MP3 are connected together, the gate-to-source voltage across each transistor MP1, MP2 and MP3 will be the same. Consequently, assuming the drain voltages of transistors MP1, MP2 and MP3 are substantially the same relative to one another, currents I1, Ipd and I2 generated by MP1, MP2 and MP3, respectively, will be substantially equal. Alternative methods for replicating the reference current Iref are similarly contemplated.

Current I2 is preferably replicated by the second current mirror 210 to generate pull-up current Ipu. Current mirror 210 comprises first and second NMOS transistor devices MN2 and MN3, respectively. Sources of transistors MN2 and MN3 are adapted for connection with VSS, a drain and gate of MN2 are connected to a drain of transistor MP3 in first current mirror 208 at node N4 and adapted to receive current I2, a gate of MN3 is connected with the gate and drain of MN2, and a drain of MN3 is connected with a pull-up monitor circuit 214 at node N5. Since the gates of transistors MN2 and MN3 are connected together and the sources of MN2 and MN3 are connected together, the gate-to-source voltage across each transistor MN2 and MN3 will be the same. Consequently, assuming the drain voltages of transistors MN2 and MN3 are substantially the same relative to one another, currents I2 and Ipu generated by MN2 and MN3, respectively, will be substantially equal.

Pull-down monitor circuit 212 and pull-up monitor circuit 214 are preferably designed to closely approximate and track the operation of pull-down and pull-up portions, respectively, of, for instance, an output stage (e.g., output stage 150 in FIG. 1B) in a buffer circuit. Pull-down monitor circuit 212 thus preferably comprises an NMOS transistor device, MN1, and a resistor, R1, coupled in series with MN1. Transistor MN1 includes a source adapted for connection with VSS, a gate operative to receive a first control signal, which may be VDDIO, and a drain connected with a first terminal of resistor R1. A second terminal of R1 is connected with first current mirror 208 at node N3 and is operative to receive pull-down current Ipd. Pull-up monitor circuit 214 preferably comprises a PMOS transistor device, MP4, and a resistor, R2, coupled in series with MP4. Transistor MP4 includes a source adapted for connection with VDDIO, a gate adapted to receive a second control signal, which may be VSS, and a drain connected with a first terminal of resistor R2. A second terminal of R2 is connected with second current mirror 210 at node N5 and is operative to receive pull-up current Ipu.

Two analog reference signals, NREF and PREF, are generated at nodes N3 and N5, respectively, which collectively reflect a status of the output stage over variations in PVT conditions to which the output stage is subjected. These two analog reference signals NREF and PREF are supplied to an analog-to-digital (A/D) converter circuit 216 where they are converted to corresponding digital control signals, CPj and CNj, where j is a positive integer, also referred to herein as PVT control bits or simply PVT bits. Digital control signals CPj and CNj are a function of PREF and NREF, respectively, as well as P-reference threshold voltages and N-reference threshold voltages (for making comparison decisions) supplied, for example, by a reference voltage source.

Specifically, A/D converter circuit 216 preferably generates a first subset of m+1 digital PVT control (i.e., compensation) bits, CP[m:0], where m is a positive integer, as a function of P-reference voltages and reference signal PREF for compensating one or more PMOS devices in an output stage of the buffer circuit to be compensated. Likewise, A/D converter circuit 216 generates a second subset of m+1 digital PVT control bits, CN[m:0], as a function of N-reference voltages and reference signal NREF for compensating one or more NMOS devices in the output stage of the buffer circuit to be compensated. It is to be understood that the invention is not limited to any particular number of digital control bits generated by A/D converter circuit 216. The number of bits (m+1) in digital control signals CPj and CNj, j=0 ... m, will depend on the desired granularity (i.e., accuracy) of compensation and area/complexity penalty. Furthermore, A/D converter circuit 216 may include latch circuitry for at least temporarily storing a logical state of digital control signals CP[m:0] and/or CN[m:0].

By using separate compensation for the pull-up and pull-down portions of the buffer circuit output stage, one can achieve fairly tight control of the respective output pull-up and pull-down impedances over all specified PVT conditions. However, the variation between PMOS and NMOS device characteristics (e.g., threshold voltage, impedance, etc.) is not identical with changes in voltage and/or temperature for a given IC fabrication process, and therefore PVT compensation circuit 200 may assign different compensation bits for pull-up and pull-down circuitry, given that the pull-up and pull-down compensation schemes are independent of one another. This will produce different impedances for the respective pull-up and pull-down circuits instantaneously, and the relative impedance mismatch ($R_{rel}$), defined as:

$$R_{rel} = \frac{R_{pu} - R_{pd}}{R_{nom}} \times 100\%, \quad (1)$$

where $R_{pu}$ is pull-up impedance, $R_{pd}$ is pull-down impedance and $R_{nom}$ is nominal impedance, may be substantially higher than what is required by a given specification. It is important to constrain $R_{rel}$ to within a prescribed limit, otherwise the difference between pull-up and pull-down impedances may contribute to higher jitter through duty cycle distortion at the output due at least in part to unequal edge rates, reflections, etc.

In order to maintain the difference between pull-up and pull-down impedances to within a prescribed limit, thereby ensuring that a given relative impedance specification is met, one can employ only pull-up compensation or, alternatively, only pull-down compensation and assign the same PVT bits for both pull-up and pull-down devices in the output stage of the buffer circuit to be compensated. However, if compensation is performed based on monitoring of pull-up device characteristics alone, then pull-down impedance will vary by a much larger amount compared to pull-up impedance over a specified range of PVT conditions (mismatch corners) to which the buffer circuit is subjected. Likewise, if compensation is performed based on monitoring of pull-down device characteristics alone, then pull-up impedance will vary by a much larger amount compared to pull-down impedance over the specified range of PVT conditions.

In another compensation approach, described above, compensation is performed using a single compensation type (e.g., either pull-up or pull-down compensation), and then the other compensation is determined as a function of the status of a monitoring circuit included in the buffer circuit. In certain implementations of the monitoring circuit, when an output of the monitoring circuit is greater than a first prescribed threshold voltage, pull-up compensation bits are incremented to generate pull-down compensation bits. Conversely, when the output of the monitoring circuit is less than a second prescribed threshold voltage, the pull-up compensation bits are decremented to generate the pull-down compensation bits. Details of this compensation methodology are described in a related U.S. application Ser. No. 13/030,278 filed on Feb. 18, 2011 and entitled "Impedance Compensation in a Buffer Circuit," the disclosure of which is incorporated by reference herein in its entirety.

At least some of the above-noted compensation techniques may suffer from one or more disadvantages, either inherently or under certain operating conditions. For example, the need for generating two sets of compensation bits often results in increased complexity, thereby increasing the required IC area of the PVT compensation circuitry. With regard to the illustrative compensation circuit 200 shown in FIG. 2, reference voltages PREF and NREF will vary over PVT conditions and are rarely close to half VDDIO at which the impedance is often measured for specification purposes. Also, in compensation circuit 200, node N1 to which external resistor 204 is connected may, in practice, include a bypass capacitor (not explicitly shown) coupled in parallel with resistor 204 if there is noise coupling in from a neighboring pin. The addition of capacitance on node N1 may render the op-amp feedback loop (comprising op-amp 206 and NMOS device Mref) unstable. In most conventional compensation schemes, either tighter impedance control or tighter mismatch control can be achieved, but generally not both. Moreover, if the mismatch between PMOS and NMOS devices changes as the IC process matures, there is essentially no means to compensate for such change.

In order to mitigate at least the above-noted problems and thereby improve buffer circuit performance, aspects of the invention advantageously perform PVT compensation using a hybrid approach, wherein the effects of both pull-up and pull-down devices are consolidated together to generate a single set of PVT compensation bits that are applied to both pull-up and pull-down drivers in the buffer circuit to be compensated. In this manner, both design complexity and IC layout area penalty are significantly reduced compared to alternative compensation approaches.

Figure 3:
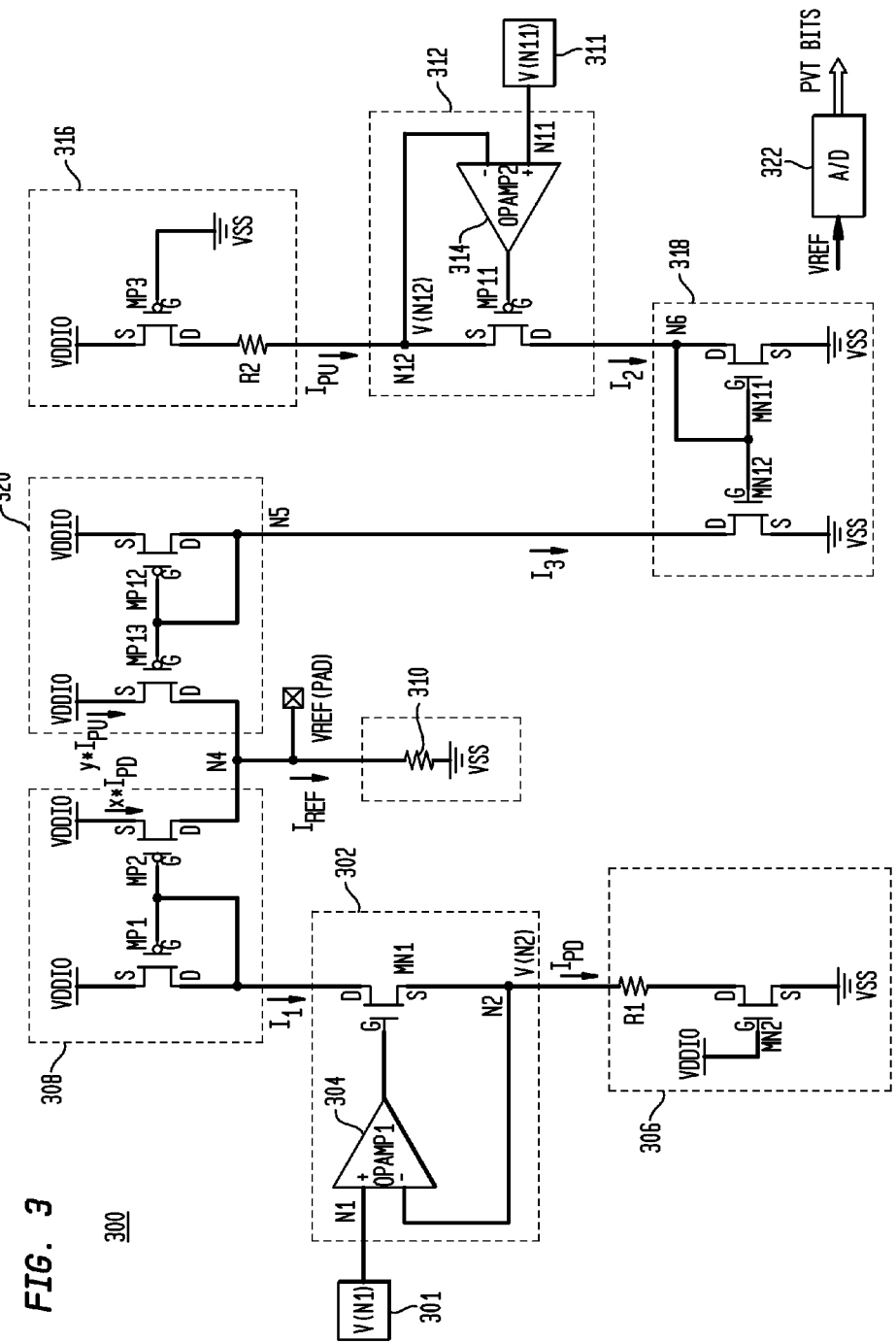
FIG. 3 is a schematic diagram depicting at least a portion of an exemplary hybrid PVT compensation circuit, according to an embodiment of the invention.

FIG. 3 is a schematic diagram depicting at least a portion of an exemplary hybrid PVT compensation circuit 300, according to an embodiment of the invention. PVT compensation circuit 300 may be employed, for example, in a compensated buffer circuit for compensating one of more PMOS and NMOS transistor devices in at least an output stage of the buffer circuit. As will be described in further detail below, compensation circuit 300 preferably comprises a monitor circuit including a pull-up portion and a pull-down portion which operatively tracks an operation of an output stage of the buffer circuit to be compensated and is operative to generate at least one control signal indicative of a status of one or more characteristics of corresponding pull-up and pull-down portions in the output stage of the buffer circuit over variations in PVT conditions to which the buffer circuit may be subjected. A control circuit coupled with the monitor circuit is operative to combine the characteristics of both pull-up and pull-down devices over variations in PVT conditions and to generate a single set of PVT compensation bits that are applied to both pull-up and pull-down drivers in the buffer circuit to be compensated.

Referring now to FIG. 3, a pull-down characteristic portion of the compensation circuit 300 will now be described, according to an embodiment of the invention. Specifically, a reference voltage, V(N1), which may be generated by a reference voltage source 301, is preferably converted into a first reference current, Ipd, which may be a pull-down reference current, by a first reference current generator circuit 302. Preferably, reference voltage V(N1) is generated in such a way that it substantially matches a prescribed voltage at which buffer circuit impedance is measured, typically half the buffer voltage supply (e.g., VDDIO/2). It is to be appreciated, however, that the invention is not limited to any specific voltage for V(N1).

The reference voltage source 301, which is operative to generate the reference voltage V(N1), may comprise, for example, a band gap reference circuit. Alternatively, the reference voltage source may comprise a simple resistor divider, such that the reference voltage V(N1) may be generated using some fraction of the voltage supply (e.g., VDDIO), in accordance with known voltage division techniques. The invention contemplates other methods for generating a reference voltage, as will become apparent to those skilled in the art. Similarly, the reference voltage V(N1) may be generated externally and supplied to the PVT compensation circuit 300.

As previously stated, pull-down reference current Ipd is generated by reference current generator circuit 302, which functions essentially as a voltage-to-current converter. Reference current generator circuit 302 preferably comprises an operational amplifier, or op-amp, (OPAMP1) 304 and an NMOS transistor device, MN1, coupled with the op-amp in a feedback configuration. Specifically, a first input of op-amp 304, which may be a non-inverting (+) input, is adapted to receive the reference voltage V(N1) at a first node N1, an output of the op-amp is connected to a gate of transistor MN1, and a second input of the op-amp, which may be an inverting (−) input, is connected with a source of MN1 at a second node N2. An output current, I1, of the reference current generator circuit 302, which is substantially equal to the pull-down current Ipd, will be generated at a drain of transistor MN1 at node N3. Op-amp 304 and NMOS device MN1 are operative in this configuration to generate a reference voltage, V(N2), at node N2 which is substantially equal to the reference voltage V(N1).

The reference voltage V(N1) is preferably replicated by reference current generator circuit 302 and applied across a pull-down circuit 306 having a pull-down impedance, Rpd, associated therewith. The pull-down circuit 306 is preferably designed to closely approximate and track the operation of a pull-down portion of, for instance, an output stage (e.g., output stage 150 in FIG. 1B) in a buffer circuit to be compensated. Pull-down circuit 306 may comprise, for example, one or multiple leg(s) of an output pull-down driver stage in the buffer circuit. Thus, the pull-down circuit 306 is not limited to the specific arrangement shown; rather, the arrangement of pull-down circuit 306 will preferably depend on the configuration of the output stage in the buffer circuit. In this embodiment, pull-down circuit 306 comprises an NMOS transistor device, MN2, and a resistor, R1, coupled in series with MN2. Transistor MN2 includes a source adapted for connection with VSS, a gate operative to receive a first control signal, which may be VDDIO, and a drain connected with a first terminal of resistor R1. A second terminal of R1 is connected with the reference current generator circuit 302 at node N2. Resistor R1 preferably comprises, for example, polysilicon, although the invention is not limited to any specific material for forming resistor R1.

Although shown as including only a single NMOS device and series resistor, pull-down circuit 306 may comprise a plurality of parallel legs (i.e., fingers), with each leg including a corresponding NMOS device and series-connected resistor, in accordance with embodiments of the invention. The effective pull-down impedance Rpd of the pull-down circuit 306 would thus be the parallel combination of the respective pull-down impedances of the plurality of legs.

The pull-down reference current Ipd will primarily be a function of the pull-down impedance Rpd of pull-down circuit 306 and the reference voltage V(N1) applied across the pull-down circuit according to the following relationship:

$$Ipd = \frac{V(N1)}{Rpd} \quad (2)$$

The pull-down impedance Rpd will primarily be a function of the value of resistor R1 and a drain-to-source on-resistance of NMOS device MN2 ($R_{MN2}$); i.e., Rpd=R1+$R_{MN2}$. Reference voltage V(N1) is preferably set equal to a voltage at which buffer impedance is measured. For example, in a DDR application, V(N1) can be set equal to VDDIO/2. It is to be understood, however, that the invention is not limited to any specific voltage for V(N1).

The reference current Ipd, which is equal to current I1, is preferably replicated using, for example, a first current mirror (P-current mirror) 308. More particularly, current mirror 308 preferably includes first and second PMOS transistor devices MP1 and MP2, respectively. Transistor MP1 is connected in a diode configuration, having a source adapted for connection with VDDIO, and a gate and drain connected to a drain of transistor MN1 in the reference current generator circuit 302 at node N3. A gate of transistor MP2 is connected with the gate of transistor MP1 at node N3, a source of MP2 is adapted for connection with VDDIO, and a drain of MP2 forms an output of the first current mirror 308 at node N4. Since the gates of transistors MP1 and MP2 are connected together and the sources of MP1 and MP2 are connected together, the gate-to-source voltage across transistors MP1 and MP2 will be the same. Consequently, for equally sized transistors, assuming the drain voltages of transistors MP1 and MP2 are substantially the same relative to one another, a current x·Ipd generated by MP2 will be equal to reference current I1. Alternative methods for replicating the reference current Ipd are similarly contemplated.

The current x·Ipd generated by current mirror 308 is preferably a scaled version of reference current Ipd (and thus current I1) generated by reference current generator circuit 302, where x is a current scaling factor. The current scaling factor x may be indicative of, for example, a ratio of a size of transistor MP1 (e.g., channel width/channel length) to a size of transistor MP2. When transistors MP1 and MP2 are identical to one another, the current scaling factor x would be equal to one. Likewise, when transistor MP2 is twice the size of transistor MP1, the current scaling factor x would be equal to two, and thus the output current generated by current mirror 308 would be equal to 2·I1. Of course, the invention is not limited to any specific current scaling value(s).

With continued reference to FIG. 3, a pull-up characteristic portion of compensation circuit 300 will now be described. Specifically, a reference voltage, V(N11), which may be generated by a reference voltage source 311, is preferably converted into a second reference current, Ipu, which may be a pull-up reference current, by a second reference current generator circuit 312. Reference voltage V(N11) is preferably generated in such a way that it substantially matches a prescribed voltage at which buffer circuit impedance is measured, typically half the buffer voltage supply (e.g., VDDIO/2). It is to be appreciated, however, that the invention is not limited to any specific voltage for V(N11).

The reference voltage source 311, which is operative to generate the reference voltage V(N11), may be formed in a manner consistent with reference voltage 301. The invention is not limited to any particular method for generating the reference voltage. Alternatively, the reference voltage V(N11) may be generated externally and supplied to the PVT compensation circuit 300. As previously stated, pull-down reference current Ipu is generated by reference current generator circuit 312, which functions as a voltage-to-current converter. Reference current generator circuit 312 preferably comprises an operational amplifier, or op-amp, (OPAMP2) 314 and a PMOS transistor device, MP11, coupled with the op-amp in a feedback configuration. Specifically, a first input of op-amp 314, which may be a non-inverting (+) input, is adapted to receive the reference voltage V(N11) at a first node N11, an output of the op-amp is connected to a gate of transistor MP11, and a second input of the op-amp, which may be an inverting (−) input, is connected with a source of MP11 at a second node N12. An output current, I2, of the reference current generator circuit 312, which is substantially equal to the reference pull-up current Ipu, will be generated at a drain of transistor MP11 at node N6. Op-amp 314 and PMOS device MP11 are operative in this configuration to generate a reference voltage, V(N12), at node N12 which is substantially equal to the reference voltage V(N11).

Reference voltage V(N11) is preferably replicated by reference current generator 312 and applied across a pull-up circuit 316 having a pull-up impedance, Rpu, associated therewith. The pull-up circuit 316 is preferably designed to closely approximate and track the operation of a pull-up portion of, for instance, an output stage (e.g., output stage 150 in FIG. 1B) in a buffer circuit to be compensated. Pull-up circuit 316 may comprise, for example, one or multiple leg(s) of an output pull-up driver stage in the buffer circuit. Thus, the pull-up circuit 316 is not limited to the specific arrangement shown; rather, the arrangement of pull-up circuit 316 will preferably depend on the configuration of the output stage in the buffer circuit. In this embodiment, pull-up circuit 316 comprises a PMOS transistor device, MP3, and a resistor, R2, coupled in series with MP3. Transistor MP3 includes a source adapted for connection with VDDIO, a gate operative to receive a second control signal, which may be VSS, and a drain connected with a first terminal of resistor R2. A second terminal of R2 is connected with the reference current generator circuit 312 at node N12. Resistor R2 preferably comprises, for example, polysilicon, although the invention is not limited to any specific material for forming resistor R2.

As in the case of pull-down circuit 306, although shown as including only a single PMOS device and series resistor, pull-up circuit 316 may comprise a plurality of parallel legs (i.e., fingers), with each leg including a corresponding PMOS device and series-connected resistor, in accordance with embodiments of the invention. The effective pull-up impedance Rpu of the pull-up circuit 316 would thus be the parallel combination of the respective pull-up impedances of the plurality of legs.

The pull-up reference current Ipu will primarily be a function of the pull-up impedance Rpu of pull-up circuit 316 and the reference voltage V(N11) applied across the pull-up circuit according to the following relationship:

$$Ipu = \frac{V(N11)}{Rpu} \quad (3)$$

The pull-up impedance Rpu will primarily be a function of the value of resistor R2 and a drain-to-source on-resistance of PMOS device MP3 ($R_{MP3}$); i.e., Rpu=R2+$R_{MP3}$. Reference voltage V(N11) is preferably set equal to a voltage at which buffer impedance is measured. For example, in a DDR application, V(N11) can be set equal to VDDIO/2. It is to be understood, however, that the invention is not limited to any specific voltage for V(N11).

The reference current Ipu, which is equal to current I2, is preferably replicated using, for example, a second current mirror (N-current mirror) 318 and a third current mirror (P-current mirror) 320. More particularly, current mirror 318 preferably includes first and second NMOS transistor devices MN11 and MN12, respectively. Transistor MN11 is connected in a diode configuration, having a source adapted for connection with VSS, and a gate and drain connected with a drain of transistor MP11 in the reference current generator circuit 312 at node N6. A gate of transistor MN12 is connected with the gate of transistor MN11 at node N6, a source of MN12 is adapted for connection with VSS, and a drain of MN12 forms an output of the second current mirror 318 at node N5. Since the gates of transistors MN11 and MN12 are connected together and the sources of MN11 and MN12 are connected together, the gate-to-source voltage across transistors MN11 and MN12 will be the same. Consequently, for equally sized transistors, assuming the drain voltages of transistors MN11 and MN12 are substantially equal to one another, a current I3 generated by MN12 will be equal to reference current I2, and thus equal to reference current Ipu.

Current I3 is replicated using current mirror 320 to generate a current, y·Ipu, which is substantially equal to current I3, and thus equal to reference current Ipu. Like current mirror 308, current mirror 320 preferably includes first and second PMOS transistor devices, MP12 and MP13, respectively. More particularly, transistor MP12 is connected in a diode configuration, having a source adapted for connection with VDDIO, and a gate and drain connected to a drain of transistor MN12 in current mirror 318 at node N5. A gate of transistor MP13 is connected with the gate of transistor MP12 at node N5, a source of MP13 is adapted for connection with VDDIO, and a drain of MP13 forms an output of the third current mirror 320 which is connected with the output of current mirror 308 at node N4. Alternative methods for replicating the reference current Ipu are similarly contemplated.

The current y·Ipu generated by current mirror 320 is preferably a scaled version of reference current Ipu (and thus current I3) generated by reference generator circuit 312, where y is a current scaling factor. The current scaling factory may be indicative of, for example, a ratio of a size of transistor MP12 to a size of transistor MP13. When transistors MP12 and MP13 are identical to one another, the current scaling factor y would be equal to one. Likewise, when transistor MP13 is twice the size of transistor MP12, the current scaling factory would be equal to two, and thus the output current generated by current mirror 320 would be equal to 2·I3.

It is to be understood that the invention is not limited to any specific current scaling value. Furthermore, it is to be appreciated that pull-up current scaling is not limited to a single current mirror (e.g., current mirror 320). Rather, pull-up current scaling can be achieved in current mirror 318 and/or current mirror 320, as will become apparent to those skilled in the art. For example, to achieve a current scaling factory of 2.25, both current mirrors 318 and 320 can be configured to scale current by 1.5, or current mirror 318 can be configured to scale current by 2.25 and current mirror 320 configured to scale current by one (i.e., no scaling), or any other combination of current scaling distributed between the two current mirrors 318, 320 configured to achieve the overall desired current scaling factor. Although the pull-down current generation path includes only one current mirror in compensation circuit 300 shown in FIG. 3, a similar approach to scaling the pull-down current can be applied when more than one current mirror is used.

The scaled pull-down reference current x·Ipd generated by current mirror 308 and the scaled pull-up reference current y·Ipu generated by current mirror 320 are preferably combined at node N4, which functions essentially as a summing junction, to generate an output reference current, Iref, which is indicative of a status (e.g., device characteristics) of both pull-down and pull-up transistor devices over variations in PVT conditions to be which the buffer circuit may be subjected. Reference current Iref is preferably converted to a voltage, Vref, using a resistor (Rext) 310 having a first terminal connected with node N4 and having a second terminal adapted for connection with a voltage source, which may be VSS. Resistor 310 is preferably a precision external resistor having a known and substantially constant resistance value associated therewith (e.g., independent of PVT conditions). It is to be understood, however, that the invention is not limited to any specific resistance value and/or resistor arrangement for resistor 310.

The reference voltage Vref generated at node N4 can be determined from the expression Vref=Iref·Rext. This voltage, which may be externally accessible via a pad (PAD) or alternative connection coupled with node N4, may be expressed by combining equations (2) and (3) above as follows:

$$Vref = Rext \cdot \left( \frac{V(N11)}{Rpu} + \frac{V(N1)}{Rpd} \right), \quad (4)$$

where, as previously defined, Rpd is pull-down impedance, Rpu is pull-up impedance, V(N1) is the reference voltage supplied to reference current generator circuit 302, and V(N11) is the reference voltage supplied to current generator circuit 312, assuming the current scaling factors x and y are both equal to one. From equation (4) it is noted that the output reference voltage Vref generated at node N4 is proportional to the reciprocal of a harmonic mean of the pull-up and pull-down impedances.

The output reference voltage Vref generated at node N4 is preferably converted to a digital signal (e.g., digital PVT bits) using, for example, an analog-to-digital (A/D) converter 322, or alternative conversion circuitry. The digital PVT bits generated by A/D converter 322 are then supplied to both pull-up and pull-down drivers of a buffer circuit to compensated (not explicitly shown) to thereby compensate the buffer circuit for variations in PVT conditions to which the buffer circuit may be subjected.

In an illustrative embodiment, both pull-down impedance and pull-up impedance of the buffer circuit to be compensated are measured at half the supply voltage (i.e., VDDIO/2), and therefore reference voltages V(N1) and V(N11) are also equal to VDDIO/2. Therefore, equation (4) above can be rewritten as follows:

$$Vref = Rext \cdot \frac{VDDIO}{2} \left( \frac{1}{Rpu} + \frac{1}{Rpd} \right) \quad (5)$$

Of course, the invention is not limited to any specific values for V(N1) and V(N11). It is to be further understood that the op-amp configuration and current mirror structures utilized in compensation circuit 300 are described herein by way of illustration only and without loss of generality, and are not intended to limit the invention in any way. As will become apparent to those skilled in the art given the teachings herein, various alternative circuit arrangements (e.g., current generation and/or replication circuitry) may be employed in accordance with other embodiments of the invention, depending upon the desired application in which the compensation circuit is to be used.

According to another aspect of the invention, current scaling in the generation of the pull-down current (i.e., in the first current mirror 308) and/or in the generation of the pull-up current (e.g., in the second and/or third current mirror 318 and 320, respectively), can be used to compensate for differences between the PMOS and NMOS transistors in the buffer circuit. For example, if the variation in NMOS device characteristics (e.g., threshold voltage, on-resistance, etc.) over all PVT corners is greater compared to the variation in PMOS device characteristics, the pull-down current scaling factor x can be made greater than the pull-up current scaling factor y (i.e., x>y), so that the pull-down current contribution x·Ipd in the resulting output reference current Iref is greater than the pull-up current contribution y·Ipu. In fact, the current mirrors 308, 318 and 320 may be designed in such a manner that different quantities of pull-up and pull-down currents could be selected after IC fabrication and/or packaging (e.g., by metal programming, programmable register, programmable fuses, etc.), according to embodiments of the invention.

According to an embodiment of the invention, one or more of current mirrors 308, 318 and 320 may be configured to provide a prescribed range of pull-up current and/or pull-down current. By way of illustration only, compensation circuit 300 may be adapted so that about 60% to 140% of pull-down current Ipd and about 60% to 140% of pull-up current Ipu can be generated and, for a given application, 80% of Ipu and 120% of Ipd can be allocated, or any other combination of respective pull-up and pull-down current percentages such that a total combined percentage is fixed (e.g., 200%). As the fabrication process matures, if there are any significant changes in PMOS and NMOS transistor device characteristics, the pull-up and pull-down current contributions can be changed accordingly by a user (e.g., metal programming, programmable register, fuse register, etc.) to achieve a desired compensation balance.

Figure 4:
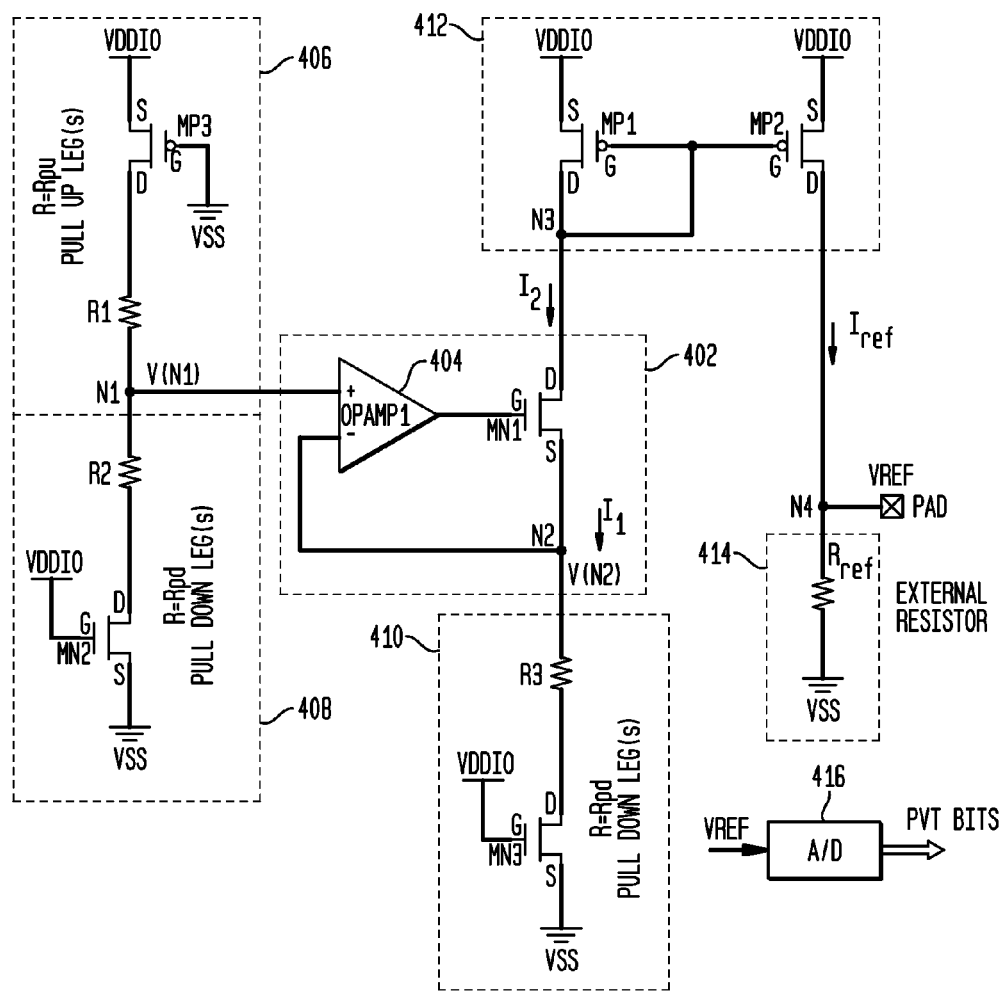
FIG. 4 is a schematic diagram depicting at least a portion of an exemplary PVT compensation circuit which utilizes an alternative hybrid compensation approach, according to an embodiment of the invention.

FIG. 4 is a schematic diagram depicting at least a portion of an exemplary PVT compensation circuit 400 utilizing an alternative hybrid compensation approach, according to an embodiment of the invention. Compensation circuit 400 may be employed, for example, in a compensated buffer circuit for compensating one of more PMOS and NMOS transistor devices in at least an output stage of the buffer circuit. Like the illustrative compensation circuit 200 shown in FIG. 2, hybrid compensation circuit 400 includes a reference current generator circuit 402 operative to generate a reference current, I1, based at least in part on a reference voltage, V(N1), supplied to the reference current generator circuit.

Specifically, reference current generator circuit 402 preferably comprises an op-amp (OPAMP1) 404 and an NMOS transistor device, MN1, coupled with the op-amp in a feedback configuration. More particularly, a first input of op-amp 404, which may be a non-inverting (+) input, is adapted to receive the reference voltage V(N1) at a first node N1, an output of the op-amp is connected to a gate of transistor MN1, a source of MN1 is connected to a second input of the op-amp, which may be an inverting (−) input, at a second node N2. In this manner, because of the feedback configuration of the op-amp 404, node N2 will be substantially equal to the reference voltage V(N1). A drain of transistor MN1 forms an output of the reference current generator circuit 402 and is operative to generate a current, I2, which is ideally equal to reference current I1 and is a function of reference voltage V(N1) and an impedance between node N2 and a voltage return of the compensation circuit 400, which may be VSS.

The reference voltage V(N1) supplied to the reference current generator circuit 402 at node N1 is preferably generated by a pull-up circuit 406 and a first pull-down circuit 408 coupled together at node N1, which essentially functions as a summing junction. Pull-up circuit 406 and pull-down circuit 408 are preferably designed to closely model and track the operation of pull-up and pull-down portions, respectively, of, for instance, an output stage (e.g., output stage 150 in FIG. 1B) in a buffer circuit to be compensated over variations in PVT conditions to which the buffer circuit may be subjected. In this regard, pull-up circuit 406 may be implemented using one or more parallel legs (e.g., fingers) in a pull-up driver portion of the buffer circuit. Similarly, pull-down circuit 408 may be implemented using one or more parallel legs in a pull-down driver portion of the buffer circuit. It is to be understood, however, that alternative circuit arrangements for accurately tracking characteristics of the pull-up and pull-down portions of the buffer output stage over variations in PVT conditions are contemplated.

Pull-up circuit 406 preferably includes a PMOS transistor device, MP3, and a first resistor, R1, coupled together in series. Specifically, a source of transistor MP3 is adapted for connection with a voltage supply of the compensation circuit 400, which may be VDDIO, a gate is adapted to receive a first control signal, which may be VSS or an alternative voltage source, and a drain of MP3 is connected with a first terminal of resistor R1. A second terminal of R1 is connected with node N1. Resistor R1 preferably comprises, for example, polysilicon, although the invention is not limited to any specific material for forming resistor R1. The first control signal is configured to turn on device MP3 during normal operation (e.g., by applying a gate-to-source voltage across MP3 which is greater than a threshold voltage of MP3) and may, optionally, be configured to turn off MP3 during, for example, a power down mode of operation of compensation circuit 400.

Likewise, pull-down circuit 408 preferably includes an NMOS transistor device, MN2, and a second resistor, R2, coupled together in series. Specifically, a source of transistor MN2 is adapted for connection with the voltage return of the compensation circuit 400, which may be VSS, a gate is adapted to receive a second control signal, which may be VDDIO or an alternative voltage source, and a drain of MN2 is connected with a first terminal of resistor R2. A second terminal of R2 is connected with pull-up circuit 406 at node N1. Resistor R2 preferably comprises, for example, polysilicon, although the invention is not limited to any specific material for forming resistor R2. The second control signal is configured to turn on device MN2 during normal operation (e.g., by applying a gate-to-source voltage across MN2 which is greater than a threshold voltage of MN2) and may, optionally, be configured to turn off MN2 during, for example, a power down mode of operation of compensation circuit 400. Together, pull-up circuit 406 and pull-down circuit 408 form a reference source operative to generate the reference voltage V(N1), as previously stated.

The output voltage V(N1) generated at node N1 will be a function of respective impedances of the pull-up and pull-down circuits 406 and 408. The effective impedance, Rpu, of pull-up circuit 406 will primarily be equal to a series combination of resistor R1 and a drain-to-source resistance, $R_{MP3}$, of transistor MP3 (i.e., Rpu=R1+$R_{MP3}$). During normal operation, when transistor MP3 is turned on, resistance $R_{MP3}$ is generally referred to as the on-resistance of the device. Likewise, the effective impedance, Rpd, of pull-down circuit 408 will primarily be equal to a series combination of resistor R2 and a drain-to-source resistance, $R_{MN2}$, of transistor MN2 (i.e., Rpd=R2+$R_{MN2}$). One or multiple legs of the pull-up and pull-down circuits 406 and 408, respectively, are preferably connected between VDDIO and VSS so that the voltage V(N1) on node N1 is about half VDDIO under nominal operating conditions of the buffer circuit (since half VDDIO is the voltage at which buffer circuit impedance is typically specified). To accomplish this, treating pull-up circuit 406 and pull-down circuit 408 as a series voltage divider, pull-up and pull-down impedances Rpu and Rpd, respectively, are preferably made equal to one another under nominal PVT conditions. As operating conditions (e.g., device characteristics, temperature, voltage, etc.) change in the pull-up and pull-down circuits 406 and 408, respectively, which are adapted to track the buffer output stage operating characteristics, the reference voltage V(N1) will vary accordingly. By virtue of the reference current generator circuit 402, a voltage at node N2, V(N2), will essentially be equal to V(N1) and can be expressed as follows:

$$V(N2) = V(N1) = VDDIO \cdot \frac{Rpd}{Rpu + Rpd} \quad (6)$$

A resistance element, which may comprise a second pull-down circuit 410, is preferably connected between node N2 and VSS, or an alternative voltage source, for sinking the current, I1, generated by reference current generator circuit 402. In the illustrative embodiment shown in FIG. 4, pull-down circuit 410 may be formed in a manner consistent with pull-down circuit 408 previously described. Specifically, pull-down circuit 410 preferably comprises an NMOS transistor device, MN3, and a resistor, R3, connected together in series. A source of device MN3 is adapted for connection with VSS, a gate is adapted to receive a third control signal, which may be VDDIO, a drain of MN3 is connected with a first terminal of resistor R3, and a second terminal of R3 is connected with the reference current generator circuit 402 at node N2. Resistor R3 preferably comprises, for example, polysilicon, although the invention is not limited to any specific material for forming resistor R3.

The current I1 flowing into pull-down circuit 410 can be expressed as follows:

$$I1 = \frac{V(N2)}{Rpd} \tag{7}$$

Ideally, when pull-down circuit 410 is substantially matched to pull-down circuit 408, so that the effective impedances Rpd of the two pull-down circuits are equal, the Rpd term in the numerator of equation (6) will cancel. More particularly, substituting equation (6) into equation (7) above yields the following:

$$I1 = \frac{VDDIO}{Rpu + Rpd} \tag{8}$$

As can be seen from equation (7), the PVT monitoring current I1 is proportional to an inverse of the arithmetic mean of the combined pull-up and pull-down impedances Rpu and Rpd, respectively.

Current I1, which flows out of the source of device MN1, will be equal to current I2 which flows into the drain of MN1. Current I2 is preferably replicated using, for example, a current mirror (P-current mirror) 412 to provide an output reference current, Iref, which advantageously tracks characteristics of both pull-up and pull-down devices in the buffer circuit over variations in PVT conditions to which the buffer circuit may be subjected. More particularly, current mirror 412 preferably includes first and second PMOS transistor devices MP1 and MP2, respectively. Transistor MP1 is connected in a diode configuration, having a source adapted for connection with VDDIO, and a gate and drain connected to the drain of transistor MN1 in reference current generator circuit 402 at node N3. A gate of transistor MP2 is connected with the gate of transistor MP1 at node N3, a source of MP2 is adapted for connection with VDDIO, and a drain of MP2 is connected with a resistive element 414, which may be an external resistor, Rref, having a first terminal connected with current mirror 412 at node N4 and having a second terminal adapted for connection to VSS, or an alternative voltage source. Since the gates of transistors MP1 and MP2 are connected together and the sources of MP1 and MP2 are connected together, the gate-to-source voltage across each transistor MP1 and MP2 will be the same. Consequently, assuming the drain voltages of transistors MP1 and MP2 are substantially the same relative to one another, currents I2 and Iref generated by MP1 and MP2, respectively, will be substantially equal. Alternative methods for replicating current I2 are similarly contemplated.

According to other embodiments of the invention, pull-down circuits 408 and 410 can be scaled relative to one another. For example, if it is determined that pull-up devices are faster than nominal, reference current I1 may be increased by adding additional legs in pull-down circuit 410. Likewise, when pull-up devices are slower than nominal, one or more legs may be removed from pull-down circuit 410 (assuming a plurality of legs are employed). In this manner, compensation circuit 400 can be adjusted to accommodate for differences between the pull-up and pull-down devices over variations in PVT conditions to which the buffer circuit may be subjected.

Reference current Iref flowing through resistor Rref will generate a reference voltage, Vref, at node N4. An input/output pad (PAD), or alternative connection means, may be connected with node N4 for providing access to the reference voltage Vref. In some applications, for example, where reference voltage Vref is routed near noisy signals and/or circuitry (e.g., clock signals, switching circuitry, etc.), it may be desirable, or even necessary, to utilize a decoupling capacitance on the pad to reduce the likelihood that unwanted noise will be introduced on the reference voltage Vref. An advantage of having the pad outside of the feedback control loop comprising reference current generator circuit 402 and pull-down circuit 410 is that this arrangement beneficially enables decoupling capacitance to be added across resistor 414 without causing an instability (e.g., oscillation) in the reference current generator circuit. In any case, the reference voltage Vref generated at node N4 will be equal to Iref×Rref, and thus Vref, like current Iref, will convey information relating to both pull-up and pull-down device characteristics over PVT variations. Voltage Vref, which is an analog signal, is preferably supplied to an A/D converter 416, or alternative conversion circuitry, operative to generate a digital signal, which may comprise PVT bits. The digital PVT bits generated by A/D converter 416 are then supplied to both pull-up and pull-down drivers of a buffer circuit to compensated to thereby compensate the buffer circuit for variations in PVT conditions to which the buffer circuit may be subjected.

Comparing the exemplary hybrid compensation circuits 300 and 400 shown in FIGS. 3 and 4, respectively, each arrangement provides certain advantages over the other. For example, compensation circuit 300 offers a greater level of control over pull-up and pull-down current scaling (e.g., by varying current scaling factors x and/or y accordingly), and therefore can achieve more accurate compensation over a prescribed range of PVT variation. However, compensation circuit 400 is a less complex implementation which provides a reduced integrated circuit area requirement. In either hybrid compensation approach, a single set of PVT bits is generated which incorporates both pull-up and pull-down device characterization information over PVT variations. Moreover, the single set of PVT bits can be supplied to both pull-up and pull-down devices in the buffer circuit to compensate for variations in PVT conditions to which the buffer circuit may be subjected.

Figure 5:
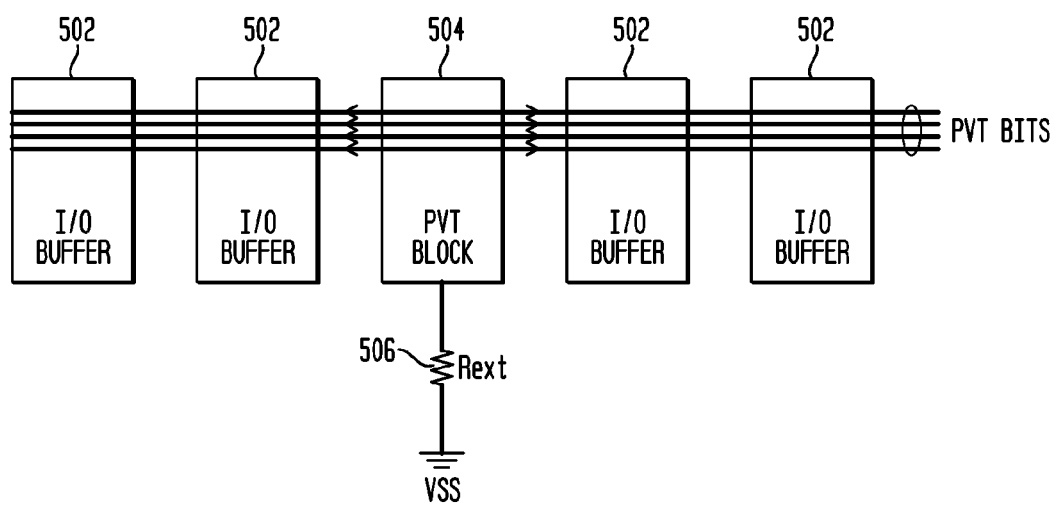
FIG. 5 is a block diagram depicting at least a portion of an exemplary compensated buffer circuit, according to an embodiment of the present invention.

With reference now to FIG. 5, a block diagram depicts at least a portion of an exemplary compensated buffer circuit 500, according to an embodiment of the invention. Compensated buffer circuit 500 includes a plurality of I/O buffers 502, each of at least a subset of the I/O buffers including control inputs adapted to receive corresponding digital control bits (PVT bits) for compensating the I/O buffers for variations in PVT conditions to which the I/O buffers may be subjected. The PVT bits are generated by a PVT block 504 operatively coupled with the I/O buffers 502 according to techniques previously described herein. An external precision resistor (Rext) 506 coupled with PVT block 504 is preferably used to control a value of reference voltage VREF in the PVT block, as previously described. Although resistor 506 is shown connected with VSS, the invention contemplates that this resistor may be connected with essentially any reference voltage source, depending on the value of VREF desired.

Furthermore, although compensated buffer circuit 500 is shown in this illustrative embodiment as including a single PVT block 504, the invention, according to alternative embodiments thereof, may include more than one PVT block. In this instance, each PVT block would be coupled with a corresponding subset of I/O buffers, with each PVT block independently generating its own set of PVT bits for compensating the respective I/O buffers coupled therewith. PVT block 504 is preferably located in close relative proximity to the corresponding I/O buffers 502 to which it is coupled. This may be beneficial, for example, to improve the accuracy of PVT compensation, particularly when the I/O buffers 502 in the compensated buffer circuit 500 are arranged on a given IC in such a manner that there is a relatively large gradient in PVT conditions among the respective I/O buffers. Thus, no limitation as to the specific number of PVT blocks 504 used in the compensated buffer circuit 500 is intended or should be inferred.

In an illustrative PVT simulation of a buffer circuit employing the inventive compensation methodology, a model preferably selects the slowest, nominal or the fastest values of the transistor devices. In practice, sheet resistance can reside anywhere within a minimum and maximum range for a given IC process. In this implementation, since polysilicon resistors (e.g., resistors R1 and/or R2 in FIG. 3, or resistors R1, R2 and/or R3 in FIG. 4) contribute to a bulk of the output impedance, the sheet resistance of the polysilicon resistors is varied between the minimum and maximum values and simulations are run for essentially all process corners, voltages and temperatures.

Figure 6B:
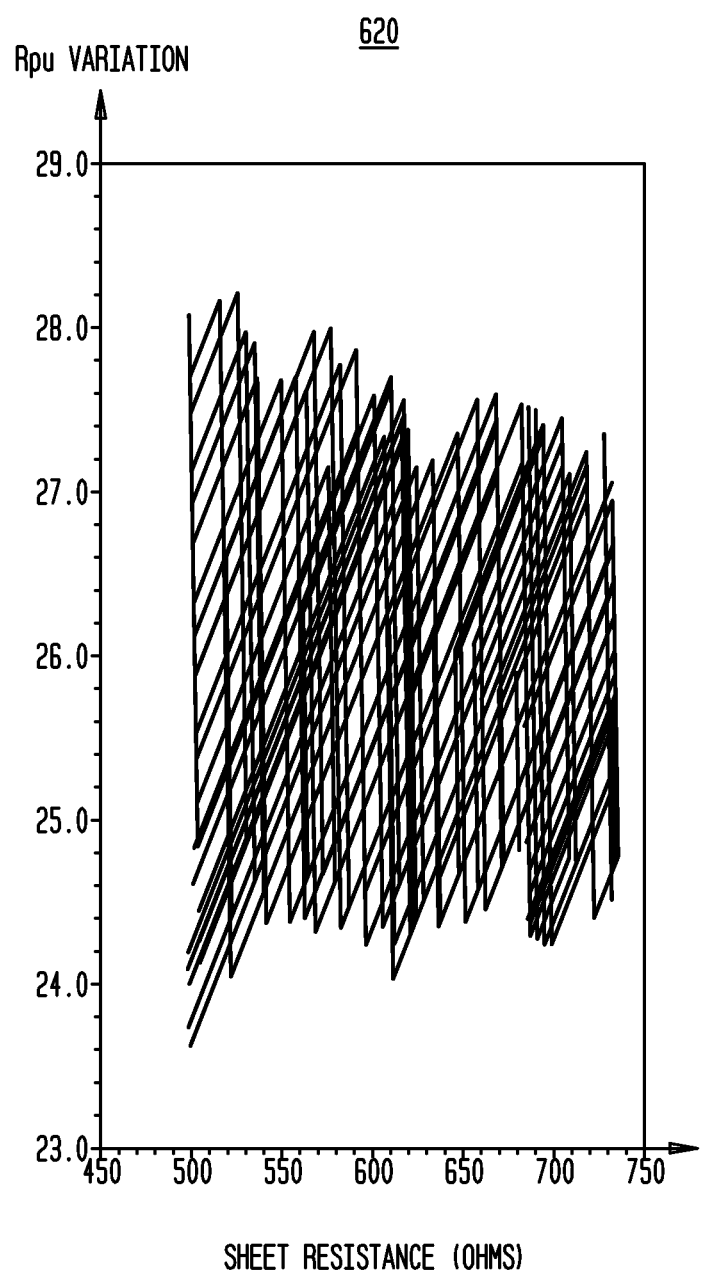
FIG. 6B is a graph including exemplary simulation waveforms illustrating the variation in pull-up impedance over a prescribed range of PVT variations.
Figure 6C:
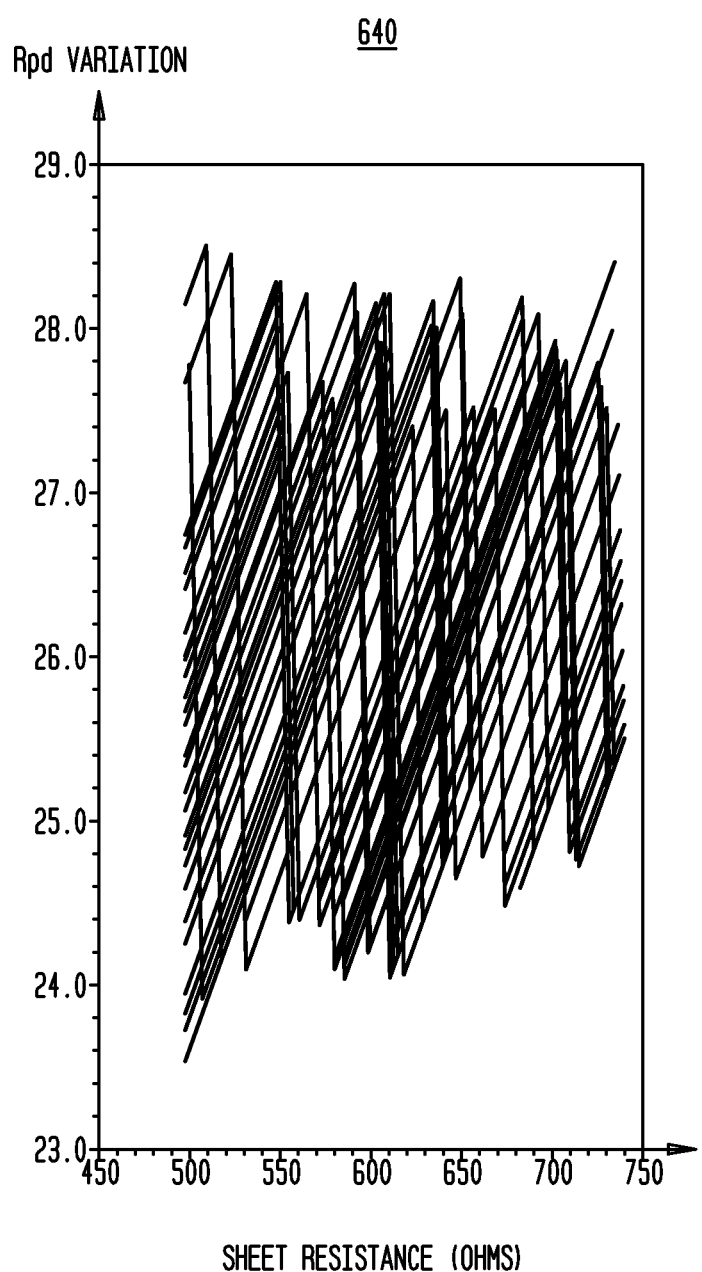
FIG. 6C is a graph including exemplary simulation waveforms illustrating the variation in pull-down impedance over a prescribed range of PVT variations.

FIG. 6A is a graph including exemplary simulation waveforms 600 illustrating a relative difference (i.e., mismatch error), Rmatch, between pull-up and pull-down impedances Rpu and Rpd, respectively, using the hybrid compensation techniques according to embodiments of the invention. FIG. 6B is a graph including exemplary simulation waveforms 620 illustrating a variation in pull-up impedance Rpu over a prescribed range of PVT variations. FIG. 6C is a graph including exemplary simulation waveforms 640 illustrating a variation in pull-down impedance Rpd over the prescribed range of PVT variations. The horizontal axis (i.e., x-axis) in each of FIGS. 6A through 6C represents the sheet resistance of the polysilicon resistors in ohms; the vertical axis (i.e., y-axis) in FIG. 6A represents the relative impedance mismatch error defined earlier; the vertical axis in FIG. 6B represents pull-up impedance Rpu variation; and the vertical axis in FIG. 6C represents pull-down impedance Rpd variation. Each individual waveform represents one PVT corner, although it is the spread in relative error across the prescribed PVT corners as presented in FIG. 6A that is of greater significance for comparison purposes.

The simulations used to generate waveforms 600, 620 and 640 are preferably configured to vary a sheet resistance of a polysilicon resistor(s) (e.g., resistors R1 and/or R2 in FIG. 3, or resistors R1, R2 and/or R3 in FIG. 4) between prescribed minimum and maximum limits under all specified PVT corners. Since resistor R1 (or, similarly, resistor R2) in FIG. 3 comprises a bulk of the output impedance, a direct current (dc) sweep of the sheet resistance under all specified PVT corners displays substantially all possible impedances of the buffer circuit. As the sheet resistance goes up, output impedance would go up and at some point the PVT compensation circuit (e.g., exemplary portions of which are illustrated in FIGS. 2 through 4) would generate one extra bit in an attempt to reduce the output impedance in the buffer circuit.

As apparent from FIG. 6A, the relative impedance mismatch using techniques of the invention exhibits variations over specified PVT conditions that are well within the typical design specification of about ±10% (e.g., about +5.7% to about −6.0%). In FIG. 6B, the nominal pull-up impedance is about 26 ohms, with a variation of ±2 ohms over specified PVT conditions. In FIG. 6C, the nominal pull-down impedance Rpd is about 26 ohms, with a variation of about ±2.5 ohms over specified PVT conditions. It can be seen the inventive methods achieve very tight variation of impedance along with tight impedance mismatch.

At least a portion of the techniques of the present invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Any of the exemplary circuits illustrated in FIGS. 1A through 5, or portions thereof, may be part of an integrated circuit. Integrated circuits so manufactured are considered part of this invention.

An integrated circuit in accordance with the present invention can be employed in essentially any application and/or electronic system in which a buffer circuit is utilized. Suitable systems for implementing techniques of the invention may include, but are not limited to, personal computers, communication networks, electronic instruments (e.g., automated test equipment (ATE)), interface networks, high-speed memory interfaces (e.g., DDR3, DDR4), etc. Systems incorporating such integrated circuits are considered part of this invention. Given the teachings of the invention provided herein, one of ordinary skill in the art will be able to contemplate other implementations and applications of the techniques of the invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A compensation circuit for controlling a variation in output impedance of at least one buffer circuit, the compensation circuit comprising:

a monitor circuit including a pull-up portion comprising at least one PMOS transistor and a pull-down portion comprising at least one NMOS transistor, the monitor circuit being configured to track an operation of an output stage of the buffer circuit and being operative to generate at least a first control signal indicative of a status of at least one characteristic of corresponding pull-up and pull-down portions in the output stage of the buffer circuit over variations in at least one of process, voltage and temperature (PVT) conditions to which the buffer circuit may be subjected; and a control circuit coupled with the monitor circuit, the control circuit being operative to generate a set of digital control bits as a function of the at least first control signal, the set of digital control bits being operative to concurrently compensate the pull-up and pull-down portions in the output stage of the buffer circuit over prescribed variations in PVT conditions;

wherein the pull-up portion in the monitor circuit comprises:

a reference circuit operative to generate at least one of a reference voltage and a reference current as a function of a second control signal supplied to the monitor circuit, the second control signal being indicative of a prescribed voltage at which a pull-up impedance of the buffer circuit is measured; and a pull-up circuit including the at least one PMOS transistor and at least a first resistor connected in series with the at least one PMOS transistor, the pull-up circuit being operative to receive the at least one of the reference voltage and the reference current and to generate a pull-up signal indicative of the status of at least one characteristic of the corresponding pull-up portion in the output stage of the buffer circuit over variations in PVT conditions to which the buffer circuit may be subjected.

2. The compensation circuit of claim 1, wherein the control circuit is operative to receive a pull-up signal from the pull-up portion of the monitor circuit and a pull-down signal from the pull-down portion of the monitor circuit and to generate to an analog reference signal indicative of a combination of the pull-up and pull-down signals.

3. The compensation circuit of claim 2, wherein the control circuit comprises an analog-to-digital converter circuit operative to receive the analog reference signal and to generate the set of digital control bits as a function of the analog reference signal.

4. The compensation circuit of claim 2, wherein the pull-up signal comprises a first current indicative of a characteristic of the pull-up portion of the output stage of the buffer circuit and the pull-down signal comprises a second current indicative of a characteristic of the pull-down portion of the output stage, and wherein the analog reference signal comprises a summation of the first and second currents.

5. The compensation circuit of claim 1, wherein the monitor circuit comprises:
a reference circuit operative to receive a second control signal and to generate a reference voltage that is substantially equal to the second control signal;
a reference source connected with the reference circuit and operative to generate the second control signal, the reference including the at least one PMOS transistor and the at least one NMOS transistor connected together as a voltage divider, the second control signal generated as a function of a pull-up impedance and a pull-down impedance associated with the PMOS and NMOS transistors, respectively;
a first pull-down circuit connected between the reference circuit and a voltage return of the compensation circuit, the second pull-down circuit including a second NMOS device and being operative to generate a reference current as a function of the reference voltage, the reference current being proportional to an inverse of an arithmetic mean of a combination of the pull-up and pull-down impedances, the first control signal being a scaled version of the reference current.

6. The compensation circuit of claim 5, wherein the reference source comprises a pull-up circuit comprising the at least one PMOS transistor and a second pull-down circuit comprising the at least one NMOS transistor, the pull-up and second pull-down circuits being connected together in series between a voltage supply and the voltage return of the compensation circuit, the second control signal being generated at a junction between the pull-up and second pull-down circuits, the second control signal being indicative of a ratio between the pull-up and pull-down impedances.

7. The compensation circuit of claim 5, wherein the first and second NMOS transistors are substantially matched with one another.

8. The compensation circuit of claim 5, wherein the monitor circuit further comprises a current mirror operative to receive the reference current and to generate the first control signal as a scaled version of the reference current.

9. A compensation circuit for controlling a variation in output impedance of at least one buffer circuit, the compensation circuit comprising:
a monitor circuit including a pull-up portion comprising at least one PMOS transistor and a pull-down portion comprising at least one NMOS transistor, the monitor circuit being configured to track an operation of an output stage of the buffer circuit and being operative to generate at least a first control signal indicative of a status of at least one characteristic of corresponding pull-up and pull-down portions in the output stage of the buffer circuit over variations in at least one of process, voltage and temperature (PVT) conditions to which the buffer circuit may be subjected; and
a control circuit coupled with the monitor circuit, the control circuit being operative to generate a set of digital control bits as a function of the at least first control signal, the set of digital control bits being operative to concurrently compensate the pull-up and pull-down portions in the output stage of the buffer circuit over prescribed variations in PVT conditions;
wherein the pull-up portion in the monitor circuit comprises:
a reference circuit operative to generate at least one of a reference voltage and a reference current as a function of a second control signal supplied to the monitor circuit, the second control signal being indicative of a prescribed voltage at which a pull-up impedance of the buffer circuit is measured; and
a pull-up circuit including the at least one PMOS transistor, the pull-up circuit being operative to receive the at least one of the reference voltage and the reference current and to generate a pull-up signal indicative of the status of at least one characteristic of the corresponding pull-up portion in the output stage of the buffer circuit over variations in PVT conditions to which the buffer circuit may be subjected;
wherein the reference circuit comprises:
an operational amplifier having a non-inverting input adapted to receive the second control signal; and
a second PMOS transistor having a first source/drain connected with an inverting input of the operational amplifier and with the pull-up circuit, a gate connected with an output of the operational amplifier, and a second source/drain adapted to output the pull-up signal.

10. A compensation circuit for controlling a variation in output impedance of at least one buffer circuit, the compensation circuit comprising:
a monitor circuit including a pull-up portion comprising at least one PMOS transistor and a pull-down portion comprising at least one NMOS transistor, the monitor circuit being configured to track an operation of an output stage of the buffer circuit and being operative to generate at least a first control signal indicative of a status of at least one characteristic of corresponding pull-up and pull-down portions in the output stage of the buffer circuit over variations in at least one of process, voltage and temperature (PVT) conditions to which the buffer circuit may be subjected; and
a control circuit coupled with the monitor circuit, the control circuit being operative to generate a set of digital control bits as a function of the at least first control signal, the set of digital control bits being operative to concurrently compensate the pull-up and pull-down portions in the output stage of the buffer circuit over prescribed variations in PVT conditions;
wherein the pull-up portion in the monitor circuit comprises:
a reference circuit operative to generate at least one of a reference voltage and a reference current as a function of a second control signal supplied to the monitor circuit, the second control signal being indicative of a prescribed voltage at which a pull-up impedance of the buffer circuit is measured;

a pull-up circuit including the at least one PMOS transistor, the pull-up circuit being operative to receive the at least one of the reference voltage and the reference current and to generate a pull-up signal indicative of the status of at least one characteristic of the corresponding pull-up portion in the output stage of the buffer circuit over variations in PVT conditions to which the buffer circuit may be subjected; and a first current mirror coupled with the pull-up circuit, the first current mirror operative to receive the pull-up signal and to generate a second pull-up signal which is a scaled version of the pull-up signal.

11. The compensation circuit of claim 10, wherein the pull-up portion in the monitor circuit further comprises a second current mirror connected with the first current mirror, the second current mirror operative to receive the second pull-signal and to generate a third pull-up signal which is a scaled version of the second pull-up signal, the first control signal comprising the third pull-up signal.

12. A compensation circuit for controlling a variation in output impedance of at least one buffer circuit, the compensation circuit comprising:

a monitor circuit including a pull-up portion comprising at least one PMOS transistor and a pull-down portion comprising at least one NMOS transistor, the monitor circuit being configured to track an operation of an output stage of the buffer circuit and being operative to generate at least a first control signal indicative of a status of at least one characteristic of corresponding pull-up and pull-down portions in the output stage of the buffer circuit over variations in at least one of process, voltage and temperature (PVT) conditions to which the buffer circuit may be subjected; and a control circuit coupled with the monitor circuit, the control circuit being operative to generate a set of digital control bits as a function of the at least first control signal, the set of digital control bits being operative to concurrently compensate the pull-up and pull-down portions in the output stage of the buffer circuit over prescribed variations in PVT conditions;

wherein the pull-down portion in the monitor circuit comprises:

a reference circuit operative to generate at least one of a reference voltage and a reference current as a function of a second control signal supplied to the monitor circuit, the second control signal being indicative of a prescribed voltage at which a pull-down impedance of the buffer circuit is measured; and a pull-down circuit including the at least one NMOS transistor and at least a first resistor connected in series with the at least one NMOS transistor, the pull-down circuit being operative to receive the at least one of the reference voltage and the reference current and to generate a pull-down signal indicative of the status of at least one characteristic of the corresponding pull-down portion in the output stage of the buffer circuit over variations PVT conditions to which the buffer circuit may be subjected.

13. A compensation circuit for controlling a variation in output impedance of at least one buffer circuit, the compensation circuit comprising:

a monitor circuit including a pull-up portion comprising at least one PMOS transistor and a pull-down portion comprising at least one NMOS transistor, the monitor circuit being configured to track an operation of an output stage of the buffer circuit and being operative to generate at least a first control signal indicative of a status of at least one characteristic of corresponding pull-up and pull-down portions in the output stage of the buffer circuit over variations in at least one of process, voltage and temperature (PVT) conditions to which the buffer circuit may be subjected; and a control circuit coupled with the monitor circuit, the control circuit being operative to generate a set of digital control bits as a function of the at least first control signal, the set of digital control bits being operative to concurrently compensate the pull-up and pull-down portions in the output stage of the buffer circuit over prescribed variations in PVT conditions;

wherein the pull-down portion in the monitor circuit comprises:

a reference circuit operative to generate at least one of a reference voltage and a reference current as a function of a second control signal supplied to the monitor circuit, the second control signal being indicative of a prescribed voltage at which a pull-down impedance of the buffer circuit is measured; and a pull-down circuit including the at least one NMOS transistor, the pull-down circuit being operative to receive the at least one of the reference voltage and the reference current and to generate a pull-down signal indicative of the status of at least one characteristic of the corresponding pull-down portion in the output stage of the buffer circuit over variations PVT conditions to which the buffer circuit may be subjected;

wherein the reference circuit comprises:

an operational amplifier having a non-inverting input adapted to receive the second control signal; and a second NMOS transistor having a first source/drain connected with an inverting input of the operational amplifier and with the pull-down circuit, a gate connected with an output of the operational amplifier, and a second source/drain adapted to output the pull-down signal.

14. A compensation circuit for controlling a variation in output impedance of at least one buffer circuit, the compensation circuit comprising:

a monitor circuit including a pull-up portion comprising at least one PMOS transistor and a pull-down portion comprising at least one NMOS transistor, the monitor circuit being configured to track an operation of an output stage of the buffer circuit and being operative to generate at least a first control signal indicative of a status of at least one characteristic of corresponding pull-up and pull-down portions in the output stage of the buffer circuit over variations in at least one of process, voltage and temperature (PVT) conditions to which the buffer circuit may be subjected; and a control circuit coupled with the monitor circuit, the control circuit being operative to generate a set of digital control bits as a function of the at least first control signal, the set of digital control bits being operative to concurrently compensate the pull-up and pull-down portions in the output stage of the buffer circuit over prescribed variations in PVT conditions;

wherein the pull-down portion in the monitor circuit comprises:

a reference circuit operative to generate at least one of a reference voltage and a reference current as a function of a second control signal supplied to the monitor circuit, the second control signal being indicative of a prescribed voltage at which a pull-down impedance of the buffer circuit is measured;

a pull-down circuit including the at least one NMOS transistor, the pull-down circuit being operative to receive the at least one of the reference voltage and the reference current and to generate a pull-down signal indicative of the status of at least one characteristic of the corresponding pull-down portion in the output stage of the buffer circuit over variations PVT conditions to which the buffer circuit may be subjected; and a first current mirror coupled with the pull-down circuit, the first current mirror operative to receive the pull-down signal and to generate a second pull-down signal which is a scaled version of the pull-down signal, the first control signal comprising the second pull-down signal.

15. A compensation circuit for controlling a variation in output impedance of at least one buffer circuit, the compensation circuit comprising:

a monitor circuit including a pull-up portion comprising at least one PMOS transistor and a pull-down portion comprising at least one NMOS transistor, the monitor circuit being configured to track an operation of an output stage of the buffer circuit and being operative to generate at least a first control signal indicative of a status of at least one characteristic of corresponding pull-up and pull-down portions in the output stage of the buffer circuit over variations in at least one of process, voltage and temperature (PVT) conditions to which the buffer circuit may be subjected; and a control circuit coupled with the monitor circuit, the control circuit being operative to generate a set of digital control bits as a function of the at least first control signal, the set of digital control bits being operative to concurrently compensate the pull-up and pull-down portions in the output stage of the buffer circuit over prescribed variations in PVT conditions;

wherein the monitor circuit comprises:

a first reference circuit operative to generate at least one of a first reference voltage and a first reference current as a function of a second control signal supplied to the monitor circuit, the second control signal being indicative of a prescribed voltage at which a pull-up impedance of the buffer circuit is measured;

a pull-up circuit including the at least one PMOS device, the pull-up circuit being operative to receive the at least one of the first reference voltage and the first reference current and to generate a pull-up signal indicative of the status of at least one characteristic of the corresponding pull-up portion in the output stage of the buffer circuit over variations in PVT conditions to which the buffer circuit may be subjected;

a second reference circuit operative to generate at least one of a second reference voltage and a second reference current as a function of a third control signal supplied to the monitor circuit, the third control signal being indicative of a prescribed voltage at which a pull-down impedance of the buffer circuit is measured; and a pull-down circuit including the at least one NMOS device, the pull-down circuit being operative to receive the at least one of the second reference voltage and the second reference current and to generate a pull-down signal indicative of the status of at least one characteristic of the corresponding pull-down portion in the output stage of the buffer circuit over variations PVT conditions to which the buffer circuit may be subjected.

16. The compensation circuit of claim 15, wherein the control circuit is operative to receive the pull-up and pull-down signals from the pull-up and pull-down portions in the monitor circuit, respectively, and to generate to an analog reference signal indicative of a combination of a scaled version of the pull-up signal and a scaled version of the pull-down signal.

17. An integrated circuit comprising at least one compensation circuit for controlling variation in output impedance of at least one buffer circuit, the at least one compensation circuit comprising:

a monitor circuit including a pull-up portion comprising at least one PMOS transistor and a pull-down portion comprising at least one NMOS transistor, the monitor circuit being configured to track an operation of an output stage of the buffer circuit and being operative to generate at least a first control signal indicative of a status of at least one characteristic of corresponding pull-up and pull-down portions in the output stage of the buffer circuit over variations in at least one of process, voltage and temperature (PVT) conditions to which the buffer circuit may be subjected; and a control circuit coupled with the monitor circuit, the control circuit being operative to generate a set of digital control bits as a function of the at least first control signal, the set of digital control bits being operative to concurrently compensate the pull-up and pull-down portions in the output stage of the buffer circuit over prescribed variations in PVT conditions;

wherein at least one of:

(i) the pull-up portion in the monitor circuit comprises:

a reference circuit operative to generate at least one of a reference voltage and a reference current as a function of a second control signal supplied to the monitor circuit, the second control signal being indicative of a prescribed voltage at which a pull-up impedance of the buffer circuit is measured; and a pull-up circuit including the at least one PMOS transistor and at least a first resistor connected in series with the at least one PMOS transistor, the pull-up circuit being operative to receive the at least one of the reference voltage and the reference current and to generate a pull-up signal indicative of the status of at least one characteristic of the corresponding pull-up portion in the output stage of the buffer circuit over variations in PVT conditions to which the buffer circuit may be subjected; and (ii) the pull-down portion in the monitor circuit comprises:

a reference circuit operative to generate at least one of a reference voltage and a reference current as a function of a second control signal supplied to the monitor circuit, the second control signal being indicative of a prescribed voltage at which a pull-down impedance of the buffer circuit is measured; and a pull-down circuit including the at least one NMOS transistor and at least a second resistor connected in series with the at least one NMOS transistor, the pull-down circuit being operative to receive the at least one of the reference voltage and the reference current and to generate a pull-down signal indicative of the status of at least one characteristic of the corresponding pull-down portion in the output stage of the buffer circuit over variations PVT conditions to which the buffer circuit may be subjected.

18. A compensated buffer circuit, comprising:

at least one buffer including an output stage operative to receive an input signal and to generate an output signal at an output of the buffer circuit, the output stage including a pull-up portion comprising at least one PMOS transistor and a pull-down portion comprising at least one NMOS transistor; and at least one compensation circuit coupled with the at least one buffer for controlling a variation in output impedance of the at least one buffer, the compensation circuit comprising:
- a monitor circuit including a pull-up portion comprising at least one PMOS transistor and a pull-down portion comprising at least one NMOS transistor, the monitor circuit being configured to track an operation of an output stage of the buffer circuit and being operative to generate at least a first control signal indicative of a status of at least one characteristic of corresponding pull-up and pull-down portions in the output stage of the buffer circuit over variations in at least one of process, voltage and temperature (PVT) conditions to which the buffer circuit may be subjected; and
- a control circuit coupled with the monitor circuit, the control circuit being operative to generate a set of digital control bits as a function of the at least first control signal, the set of digital control bits being operative to concurrently compensate the pull-up and pull-down portions in the output stage of the buffer circuit over prescribed variations in PVT conditions;

wherein at least one of:
(i) the pull-up portion in the monitor circuit comprises:
- a reference circuit operative to generate at least one of a reference voltage and a reference current as a function of a second control signal supplied to the monitor circuit, the second control signal being indicative of a prescribed voltage at which a pull-up impedance of the buffer circuit is measured; and
- a pull-up circuit including the at least one PMOS transistor and at least a first resistor connected in series with the at least one PMOS transistor, the pull-up circuit being operative to receive the at least one of the reference voltage and the reference current and to generate a pull-up signal indicative of the status of at least one characteristic of the corresponding pull-up portion in the output stage of the buffer circuit over variations in PVT conditions to which the buffer circuit may be subjected; and (ii) the pull-down portion in the monitor circuit comprises:
- a reference circuit operative to generate at least one of a reference voltage and a reference current as a function of a second control signal supplied to the monitor circuit, the second control signal being indicative of a prescribed voltage at which a pull-down impedance of the buffer circuit is measured; and
- a pull-down circuit including the at least one NMOS transistor and at least a second resistor connected in series with the at least one NMOS transistor, the pull-down circuit being operative to receive the at least one of the reference voltage and the reference current and to generate a pull-down signal indicative of the status of at least one characteristic of the corresponding pull-down portion in the output stage of the buffer circuit over variations PVT conditions to which the buffer circuit may be subjected.

19. The buffer circuit of claim 18, wherein the at least one buffer comprises a plurality of buffers and the at least one compensation circuit comprises a plurality of compensation circuits, a first one of the compensation circuits being coupled with a first subset of the buffers for controlling a variation in output impedance of the first subset of buffers, and at least a second one of the compensation circuits being coupled with a second subset of the buffers for controlling a variation in output impedance of the second subset of buffers.

20. An electronic system, comprising:
at least one integrated circuit, the at least one integrated circuit including at least one compensation circuit for controlling a variation in output impedance of at least one buffer circuit with which the compensation circuit is operatively coupled, the at least one compensation circuit comprising:
- a monitor circuit including a pull-up portion comprising at least one PMOS transistor and a pull-down portion comprising at least one NMOS transistor, the monitor circuit being configured to track an operation of an output stage of the buffer circuit and being operative to generate at least a first control signal indicative of a status of at least one characteristic of corresponding pull-up and pull-down portions in the output stage of the buffer circuit over variations in at least one of process, voltage and temperature (PVT) conditions to which the buffer circuit may be subjected; and
- a control circuit coupled with the monitor circuit, the control circuit being operative to generate a set of digital control bits as a function of the at least first control signal, the set of digital control bits being operative to concurrently compensate the pull-up and pull-down portions in the output stage of the buffer circuit over prescribed variations in PVT conditions;

wherein at least one of:
(i) the pull-up portion in the monitor circuit comprises:
- a reference circuit operative to generate at least one of a reference voltage and a reference current as a function of a second control signal supplied to the monitor circuit, the second control signal being indicative of a prescribed voltage at which a pull-up impedance of the buffer circuit is measured; and
- a pull-up circuit including the at least one PMOS transistor and at least a first resistor connected in series with the at least one PMOS transistor, the circuit being operative to receive the at least one of the reference voltage and the reference current and to generate a pull-up signal indicative of the status of at least one characteristic of the corresponding pull-up portion in the output stage of the buffer circuit over variations in PVT conditions to which the buffer circuit may be subjected; and (ii) the pull-down portion in the monitor circuit comprises:
- a reference circuit operative to generate at least one of a reference voltage and a reference current as a function of a second control signal supplied to the monitor circuit, the second control signal being indicative of a prescribed voltage at which a pull-down impedance of the buffer circuit is measured; and
a pull-down circuit including the at least one NMOS transistor and at least a second resistor connected in series with the at least one NMOS transistor, the pull-down circuit being operative to receive the at least one of the reference voltage and the reference current and to generate a pull-down signal indicative of the status of at least one characteristic of the corresponding pull-down portion in the output stage of the buffer circuit over variations PVT conditions to which the buffer circuit may be subjected.

* * * * *